US012666997B2

(12) United States Patent
Chang

(10) Patent No.: US 12,666,997 B2
(45) Date of Patent: Jun. 23, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventor: Jen-Yuan Chang, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 744 days.

(21) Appl. No.: 17/814,003

(22) Filed: Jul. 21, 2022

(65) Prior Publication Data

US 2023/0025662 A1     Jan. 26, 2023

Related U.S. Application Data

(60) Provisional application No. 63/225,371, filed on Jul. 23, 2021.

(51) Int. Cl.
*H10W 74/10*       (2026.01)
*H10W 74/00*       (2026.01)
(Continued)

(52) U.S. Cl.
CPC ....... *H10W 74/141* (2026.01); *H10W 74/014* (2026.01); *H10W 90/00* (2026.01); *H10W 74/00* (2026.01); *H10W 80/312* (2026.01); *H10W 80/327* (2026.01); *H10W 90/724* (2026.01); *H10W 90/734* (2026.01); *H10W 90/792* (2026.01); *H10W 90/794* (2026.01)

(58) Field of Classification Search
CPC ... H01L 23/3185; H01L 21/561; H01L 24/08; H01L 24/32; H01L 24/80; H01L 25/0652; H01L 24/16; H01L 2224/08146; H01L 2224/08225; H01L 2224/16225; H01L 2224/32225; H01L 2224/80895; H01L 2224/80896; H01L 2924/1434; H01L 2924/182; H01L 2924/3512; H01L 2224/08145; H01L 2225/06541; H01L 25/50; H01L 25/0657
See application file for complete search history.

(56) References Cited

U.S. PATENT DOCUMENTS 7,993,983 B1 *   8/2011  Lin ..................... H01L 23/3128
                                                                        438/126
12,079,475 B1 *  9/2024  Mathuriya .......... G11C 11/4093
(Continued)

*Primary Examiner* — Ratisha Mehta
*Assistant Examiner* — Thaddeus J. Kolb
(74) *Attorney, Agent, or Firm* — McClure, Qualey & Rodack, LLP

(57) ABSTRACT

A semiconductor structure is provided, and includes a substrate and a plurality of devices disposed over the substrate. The semiconductor structure includes an interconnect structure disposed over the substrate and electronically connected to the devices. The semiconductor structure also includes a bonding film formed over the interconnect structure. The semiconductor structure further includes a protective layer formed on sidewalls of the substrate, the interconnect structure and the bonding film. In addition, the semiconductor structure includes a dielectric material formed on a sidewall of the protective layer and overlapping with the protective layer in a top view.

20 Claims, 23 Drawing Sheets

(51) Int. Cl.
  *H10W 74/01*        (2026.01)
  *H10W 80/00*        (2026.01)
  *H10W 90/00*        (2026.01)

(56)                References Cited

U.S. PATENT DOCUMENTS

2015/0010269 A1*   1/2015   Jo ............................ G02B 6/43
                                                               385/14
2019/0279883 A1*   9/2019   Kim ...................... H01L 23/552
2021/0028217 A1*   1/2021   Cho ................... H01L 21/6836
2021/0066279 A1*   3/2021   Yu ........................... H01L 24/20
2021/0082865 A1*   3/2021   Baraskar ............... H10B 43/40
2021/0335715 A1*  10/2021   Kao .................... H01L 21/4857
2022/0139805 A1*   5/2022   Shih ........................ H01L 24/83
                                                               257/774
2022/0351901 A1*  11/2022   Newlin .................. H01F 41/10
2022/0415835 A1*  12/2022   Bae ..................... H01L 25/0657
2023/0197685 A1*   6/2023   Karhade ................ H01L 25/50
                                                               257/777
2023/0197819 A1*   6/2023   Bouche ............. H10D 84/0151
                                                               257/401
2023/0335696 A1*  10/2023   Kono ................... H10H 20/841
2024/0215244 A1*   6/2024   Tanaka ............... H01L 25/0657

* cited by examiner

SEMICONDUCTOR STRUCTURE AND METHOD FOR FORMING THE SAME

PRIORITY CLAIM AND CROSS-REFERENCE

This application claims the benefit of U.S. Provisional Application No. 63/225,371 filed Jul. 23, 2021, the entirety of which is incorporated by reference herein.

BACKGROUND

The semiconductor industry continues to improve the integration density of various electronic components (e.g., transistors, diodes, resistors, capacitors, etc.) by continual reductions in minimum feature size, which allow more components to be integrated into a given area. The individual dies are typically packaged separately. A package not only provides protection for semiconductor devices from environmental contaminants, but also provides a connection interface for the semiconductor devices packaged therein.

Three dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by placing dies over dies on a semiconductor wafer level. 3DICs provide improved integration density and other advantages, such as faster speeds and higher bandwidth, because of the decreased length of interconnects between the stacked dies, for example. However, there are many challenges related to 3DICs.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
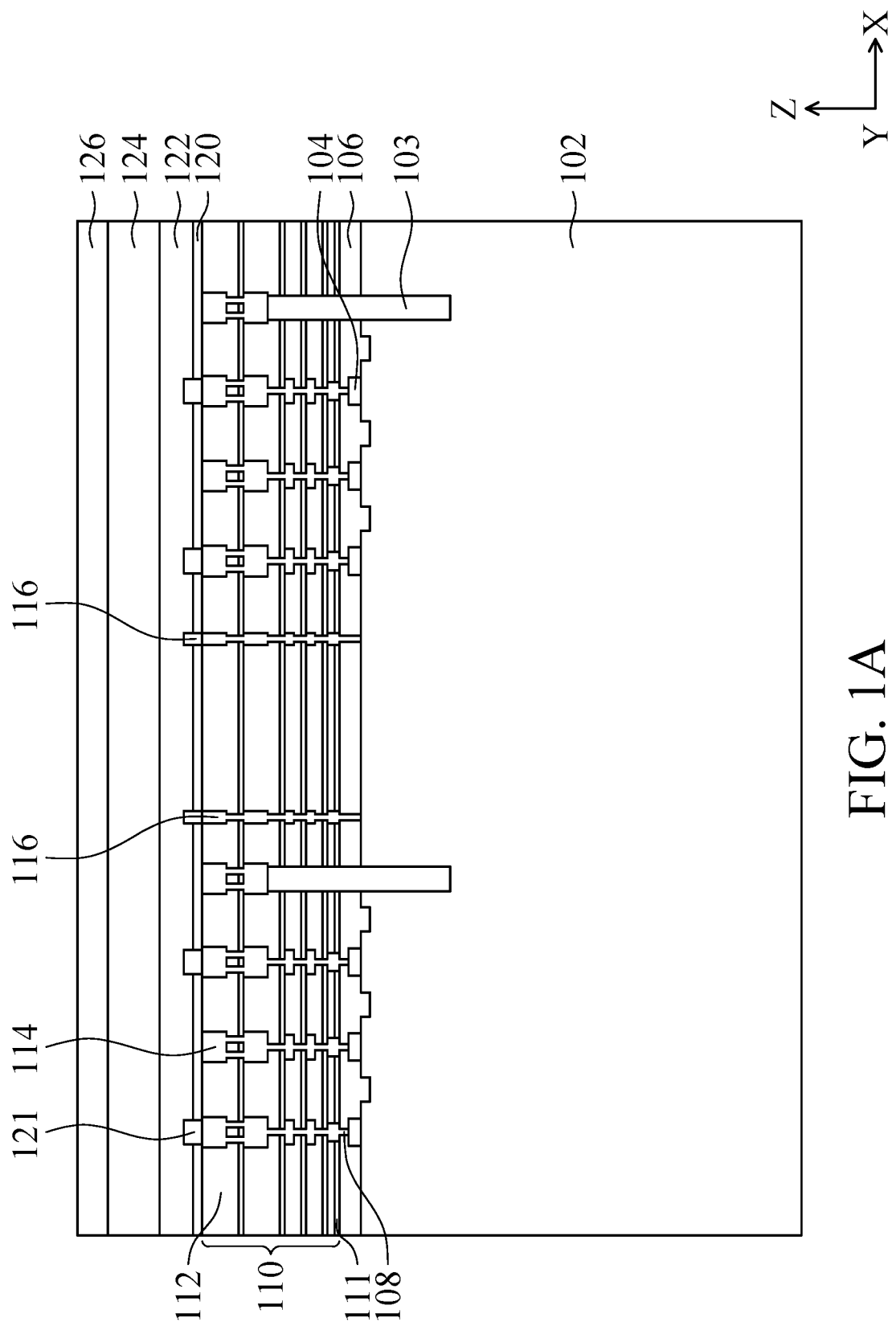
FIGS. 1A-1K are cross-sectional views illustrating various stages of forming a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures are provided. The semiconductor structure includes a protective layer formed on sidewalls of each semiconductor die. The protective layer provides protection from the subsequently filled dielectric material or moisture for the inner structure of the semiconductor dies.

FIGS. 1A-1K are perspective views illustrating various stages of forming a semiconductor package 10 in accordance with some embodiments. In some embodiments, a semiconductor die 100 is formed in a wafer, which may include different device regions that are singulated in subsequent steps to form a plurality of semiconductor dies. In some embodiments, the semiconductor die 100 is processed according to applicable manufacturing processes to form integrated circuits. For example, the semiconductor die 100 includes a semiconductor substrate 102, such as silicon, doped or undoped, or an active layer of a semiconductor-on-insulator (SOI) substrate. In some embodiments, the semiconductor substrate 102 includes other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. In some embodiments, the semiconductor substrate 102 has an active surface (e.g., the surface facing upwards in FIG. 1A), sometimes called a front side and an inactive surface (e.g., the surface facing downwards in FIG. 1A), sometimes called a back side.

In some embodiments, devices 104 are formed at the front side of the semiconductor substrate 102. In some embodiments, the devices 104 are active devices (e.g., transistors, diodes, etc.), capacitors, resistors, etc. For example, the devices 104 are metal-oxide-semiconductor field-effect transistor (MOSFET), in accordance with some embodiments of the present disclosure. An inter-layer dielectric (ILD) 106 is over the front side of the semiconductor substrate 102. In some embodiments, the ILD 106 surrounds and may cover the devices 104. In some embodiments, the ILD 106 includes one or more dielectric layers formed of materials such as silicon dioxide ($SiO_2$), Phospho-Silicate Glass (PSG), Boro-Silicate Glass (BSG), Boron-Doped Phospho-Silicate Glass (BPSG), undoped Silicate Glass (USG), or the like.

In some embodiments, conductive plugs 108 extend through the ILD 106 to electrically and physically couple the devices 104. For example, when the devices 104 are transistors, the conductive plugs 108 may couple the gates or source/drain regions of the transistors. Source/drain regions may refer to a source or a drain, individually or collectively dependent upon the context. In some embodiments, the conductive plugs 108 is formed of tungsten (W), cobalt (Co), nickel (Ni), copper (Cu), silver (Ag), gold (Au), aluminum (Al), any other suitable conductive material, or combinations thereof. An interconnect structure 110 is over the ILD 106 and conductive plugs 108. The interconnect structure 110 interconnects the devices 104 to form an integrated circuit. In some embodiments, the interconnect structure 110 is formed by, for example, metallization patterns 114 in dielectric layers 112 over the ILD 106. The metallization patterns 114 include metal lines and vias formed in one or more dielectric layers 112. The metallization patterns 114 of the interconnect structure 110 are electrically coupled to the devices 104 by the conductive plugs 108. For example, the metallization patterns 114 include conductive material such as tungsten (W), cobalt (Co), nickel (Ni), copper (Cu), silver (Ag), gold (Au), aluminum (Al), any other suitable conductive material, or a combination thereof. However, the present disclosure is not limited thereto.

In some embodiments, the interconnect structure 110 further includes a plurality of etch stop layers 111 that are alternatively stacked with the dielectric layers 112. The etch stop layers 111 are formed in order to form the metallization patterns 114 in the patterned dielectric layers 112 and protect the lower portion of the interconnect structure 110 during the processes forming the upper portion of the interconnect structure 110. For example, the etch stop layers 111 include dielectric material such as silicon nitride (SiN), silicon carbide (SiC), any other suitable material, or a combination thereof. In some embodiments, the dielectric layers 112 include dielectric material such as USG, low-k material, extreme low-k material, $SiO_2$, any other suitable material, or a combination thereof. However, the present disclosure is not limited thereto. In some embodiments, the material of the etch stop layers 111 is different from the material of the dielectric layers 112.

In some embodiments, the interconnect structure 110 further includes one or more seal rings 116. The seal ring 116 is formed surrounding the metallization patterns 114. The seal ring 116 provides protection to circuit structures in the interconnect structure 110 against undesired elements from the exterior environment, such as water vapor, during and after separation of the semiconductor dies 100 (such as referring to FIG. 1F). The seal ring 116 may be formed by any suitable designs and with any suitable materials, such as materials suitable as moisture barrier. In some embodiments, the seal ring 116 may be formed by the same material and the same processes as the metallization patterns 114. For example, the seal ring 116 may be formed tungsten (W), cobalt (Co), nickel (Ni), copper (Cu), silver (Ag), gold (Au), aluminum (Al), or related alloys. In some embodiments, the seal ring 116 may be electrically grounded.

In some embodiments, a plurality of through-silicon vias (TSVs) 103 are formed through the semiconductor substrate 102 and extend into the interconnect structure 110. In some embodiments, the TSVs 103 are electrically connected to the metallization patterns 114 of the interconnect structure 110 for forming a conductive path connected to external environment (e.g. another semiconductor die or external devices). For example, the TSVs 103 include conductive material such as tungsten (W), cobalt (Co), nickel (Ni), copper (Cu), silver (Ag), gold (Au), aluminum (Al), any other suitable conductive material, or a combination thereof.

The semiconductor die 100 further includes pads 121, such as aluminum pads, copper pads, etc., to which external connections are made. The pads 121 are on the active side of the semiconductor die 100, such as in and/or on the interconnect structure 110. One or more passivation films 120 are on the semiconductor die 100, such as on portions of the interconnect structure 110 and pads 121. Openings extend through the passivation films 120 to the pads 121. For example, the passivation film 120 includes passivation material such as SiN, USG, $SiO_2$, any suitable material, or a combination thereof.

A dielectric layer 122 may (or may not) be on the active side of the semiconductor die 100, such as on the passivation films 120. In some embodiments, the dielectric layer 122 may bury the pads 121, such that the topmost surface of the dielectric layer 122 is above the topmost surfaces of the pads 121. In some embodiments, the dielectric layer 122 includes a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. In some embodiments, the dielectric layer 122 is formed, for example, by spin coating, lamination, chemical vapor deposition (CVD), or the like.

In some embodiments, a first bonding film 124 and a second bonding film 126 are formed over the interconnect structure 110 and the dielectric layer 122 and provided for subsequent bonding process. For example, the material of the first bonding film 124 includes $SiO_2$, any other suitable material, or a combination thereof. The material of the second bonding film 126 includes SiON, $SiO_2$, any other suitable material, or a combination thereof. In some embodiments, the material of the first bonding film 124 is the same as the material of the second bonding film 126. Although two bonding films (e.g. the first bonding film 124 and the second bonding film 126) are shown in the present disclosure, it should be appreciated that one or multiple (more than two) bonding films are also adopted in the present disclosure. For the sake of simplicity, the first bonding film 124 and the second bonding film 126 may be collectively referred to as the bonding films 124 and 126 in the following paragraphs.

In some embodiments, the semiconductor die 100 is a stacked device that includes multiple semiconductor substrates 102. For example, the semiconductor die 100 may be a memory device such as a hybrid memory cube (HMC) module, a high bandwidth memory (HBM) module, or the like that includes multiple memory dies. In such embodiments, the semiconductor die 100 includes multiple semiconductor substrates 102 interconnected by through-substrate vias (TSVs). Each of the semiconductor substrates 102 may (or may not) have an interconnect structure 110.

Figure 1B:
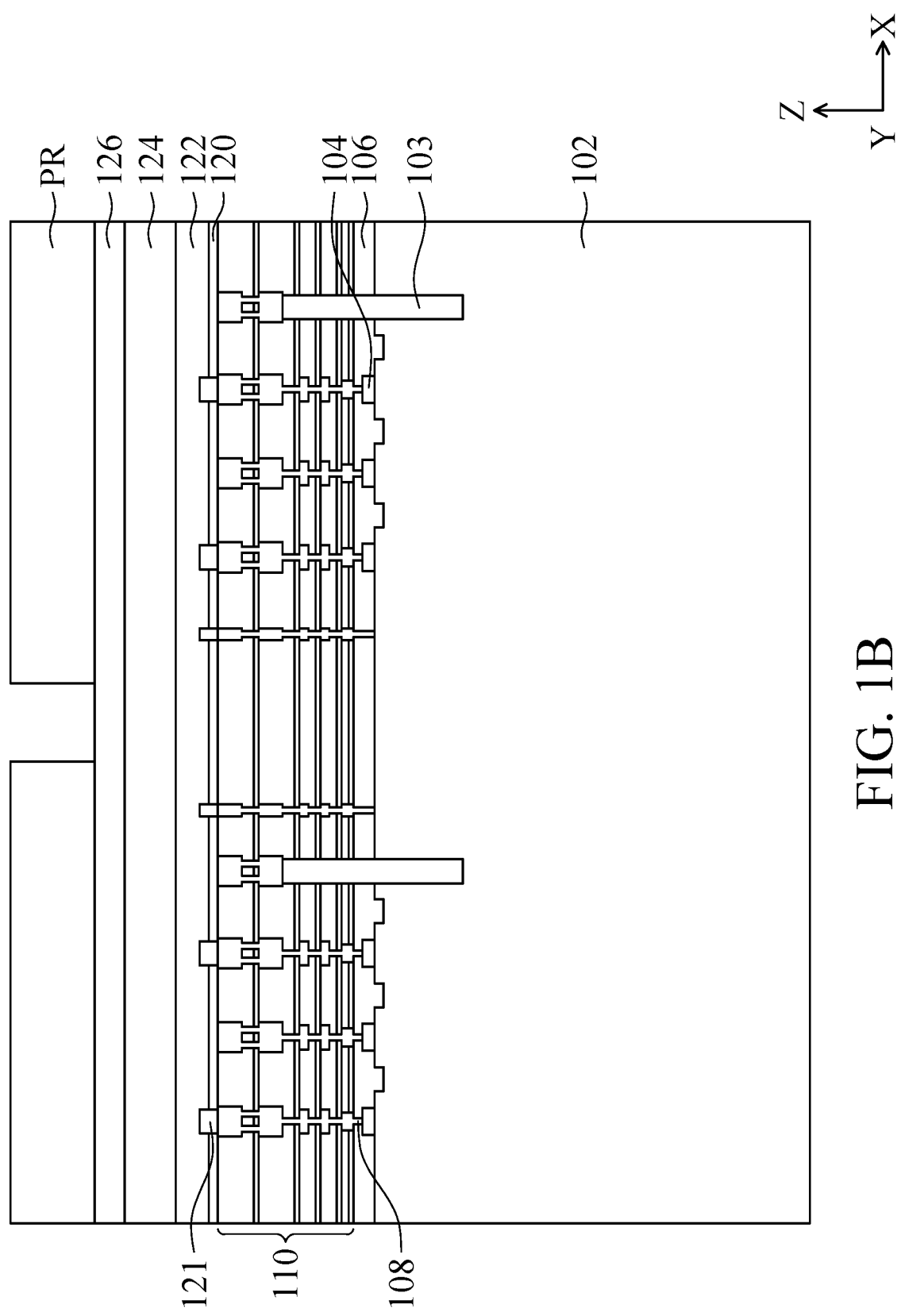

As shown in FIG. 1B, a patterned photoresist layer PR is formed over the bonding films 124 and 126. The patterned photoresist layer PR may be formed by a deposition process and a patterning process. The deposition process for forming the patterned photoresist layer PR may include a chemical vapor deposition (CVD) process, a high-density plasma chemical vapor deposition (HDPCVD) process, a spin-on process, a sputtering process, or another applicable process. The patterning process for forming the patterned photoresist layer PR may include a photolithography process and an etching process. The photolithography process may include photoresist coating (e.g., spin-on coating), soft baking, mask aligning, exposure, post-exposure baking, developing the photoresist, rinsing, and drying (e.g., hard baking). The etching process may include a dry etching process or a wet etching process.

Figure 1C:
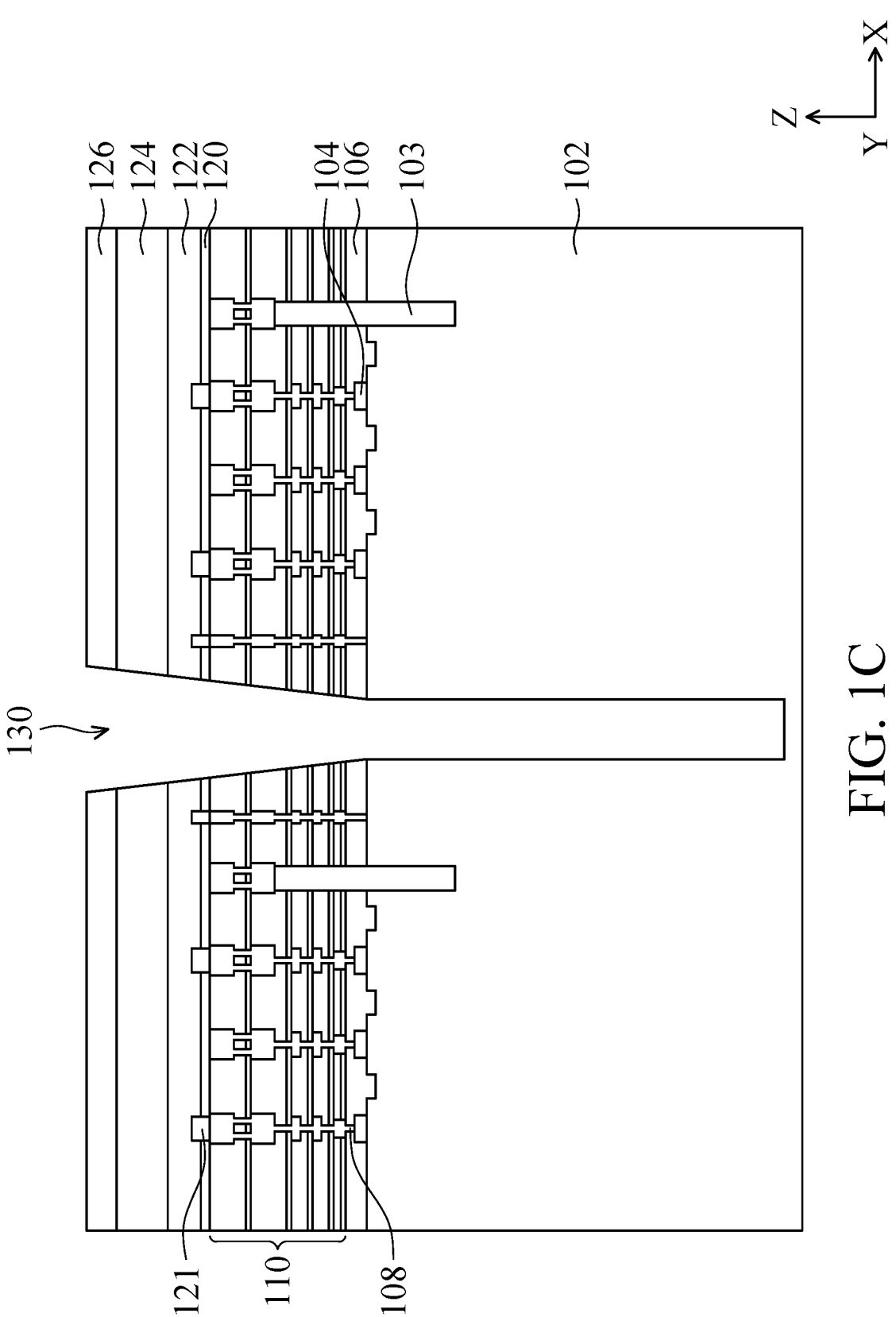

Then, as shown in FIG. 1C, an opening 130 may be formed by performing an etching process, using the patterned photoresist layer 108 as a mask. The etching process may be a dry etching process or a wet etching process. In some embodiments, the dry etching process includes using a fluorine-based etchant gas, such as $SF_6$, $C_xF_y$, $NF_3$ or a combination thereof. The etching process may be a time-controlled process, and continue until the opening 130 extends from the second bonding film 126 to the semiconductor substrate 102. In some embodiments, the opening 130 does not fully penetrate the semiconductor substrate 102. In some other embodiments, the opening 130 has a width that gradually decreases from the top portion to the lower portion. Afterwards, the patterned photoresist layer PR is removed.

Figure 1D:
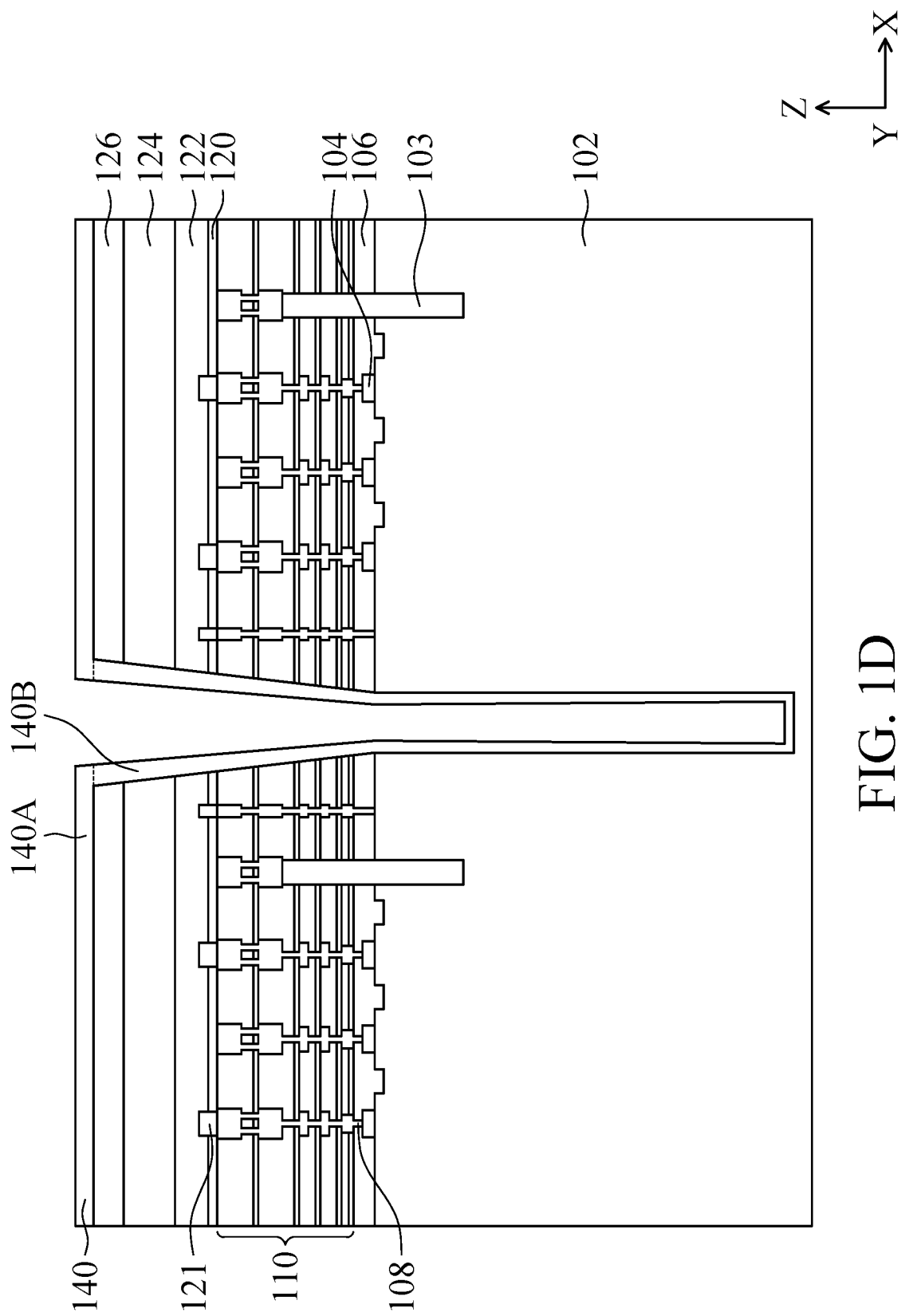

Next, as shown in FIG. 1D, a protective material 140 is formed over the semiconductor substrate 102. In some embodiments, the protective material 140 is deposited over the bonding films 124 and 126 and formed in the opening 130, and therefore the protective material 140 may be divided into a first portion 140A over the bonding films 124 and 126 and a second portion 140B in the opening 130. The second portion 140B continuously extends from the sidewall of the bonding films 124 and 126 to the sidewall of the semiconductor substrate 102. Accordingly, the second portion 140B covers the sidewalls of the bonding films 124 and 126, the interconnect structure 110, and the semiconductor substrate 102, and also covers a portion of the front surface of the semiconductor substrate 102. In some embodiments, the second portion 140B is formed with an inconsistent width since the opening 130 has a tapered shape. In some embodiments, the protective material 140 is conformally deposited over the lower structure, and therefor has a constant width (or thickness).

In some embodiments, the protective material 140 is formed, for example, by spin coating, lamination, chemical vapor deposition (CVD), or any other applicable method. For example, the protective material 140 includes tetra-ethoxysilane (TEOS), $SiO_2$, or any other suitable dielectric material.

Figure 1E:
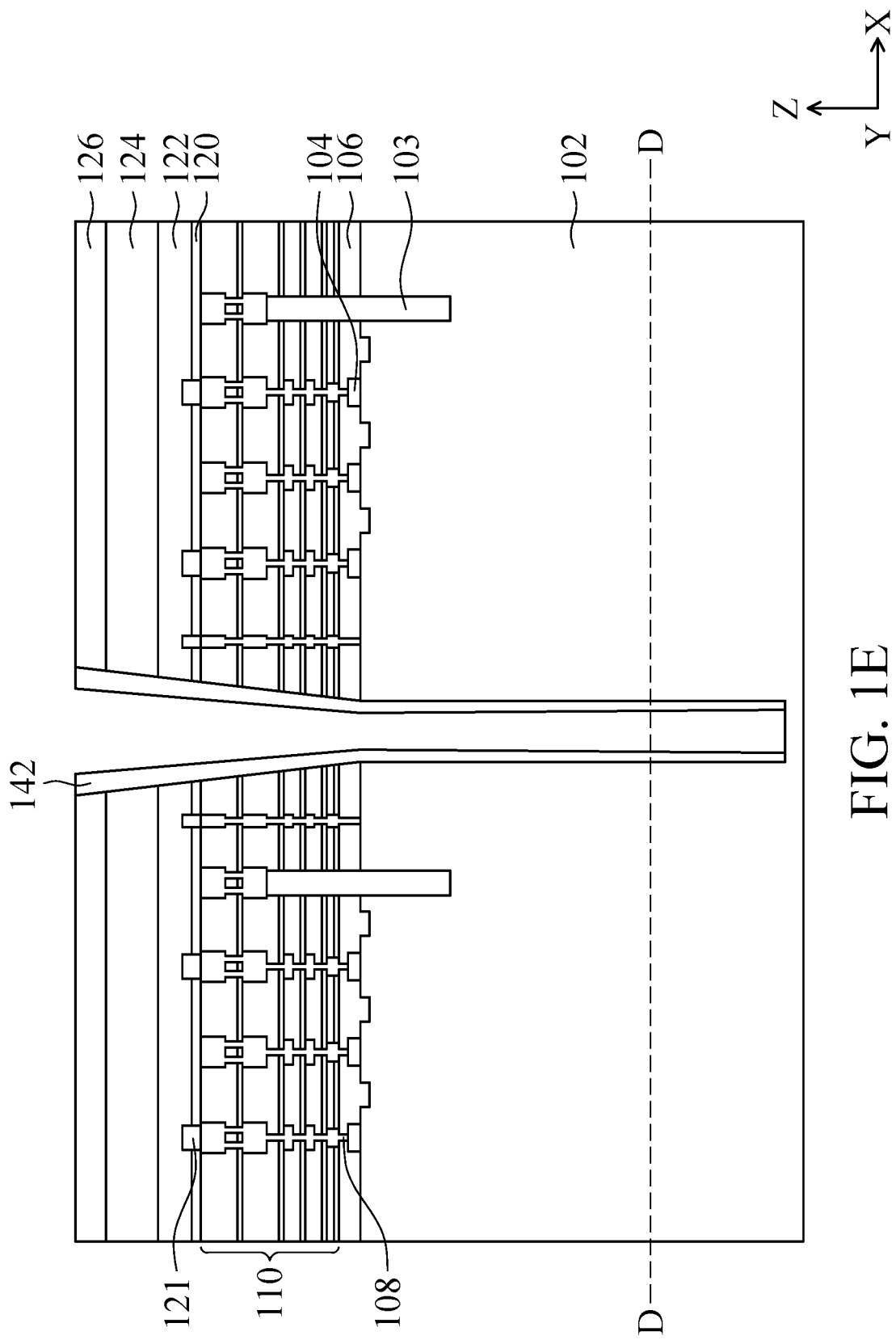

Then, as shown in FIG. 1E, the first portion 140A of the protective material 140 is removed, leaving the second portion 140B in the opening 130. In some embodiments, the first portion 140A is removed using an etch back process, and the top surface of the second portion 140B is substantially level with the top surface of the bonding film 126 after the first portion 140A is removed. However, the present disclosure is not limited thereto. Any other suitable planarization method (e.g. chemical mechanical polish (CMP) process) may also be adopted to remove the first portion 140A.

In some embodiments, a plurality of semiconductor dies 100 (see FIG. 1F) may be singulated by partially removing the semiconductor substrate 102 and the second portion 140B of the protective material 140. For example, a polishing process may be performed to the back side of the semiconductor substrate 102. In some embodiments, the polishing process is performed to remove the structure below the line D-D, for example, and therefore the semiconductor dies 100 may be singulated and a protective layer 142 is formed from the remaining second portion 140B of the protective material 140, in accordance with some embodiments shown in FIG. 1F. Accordingly, the protective layer 142 is formed on sidewalls of the semiconductor dies 100.

Optionally, solder regions (e.g., solder balls or solder bumps) may be disposed on and electrically connected to the interconnect structure. In some embodiments, some solder balls are used to perform chip probe (CP) testing on the semiconductor die 100. In some embodiments, the CP testing is performed on the semiconductor die 100 to ascertain whether the semiconductor die 100 is a known good die (KGD). In some embodiments, only semiconductor dies 100, which are KGDs, undergo subsequent processing and are packaged, and dies, which fail the CP testing, are not packaged. After testing, the solder regions may be removed in subsequent processing steps.

Figure 1F:
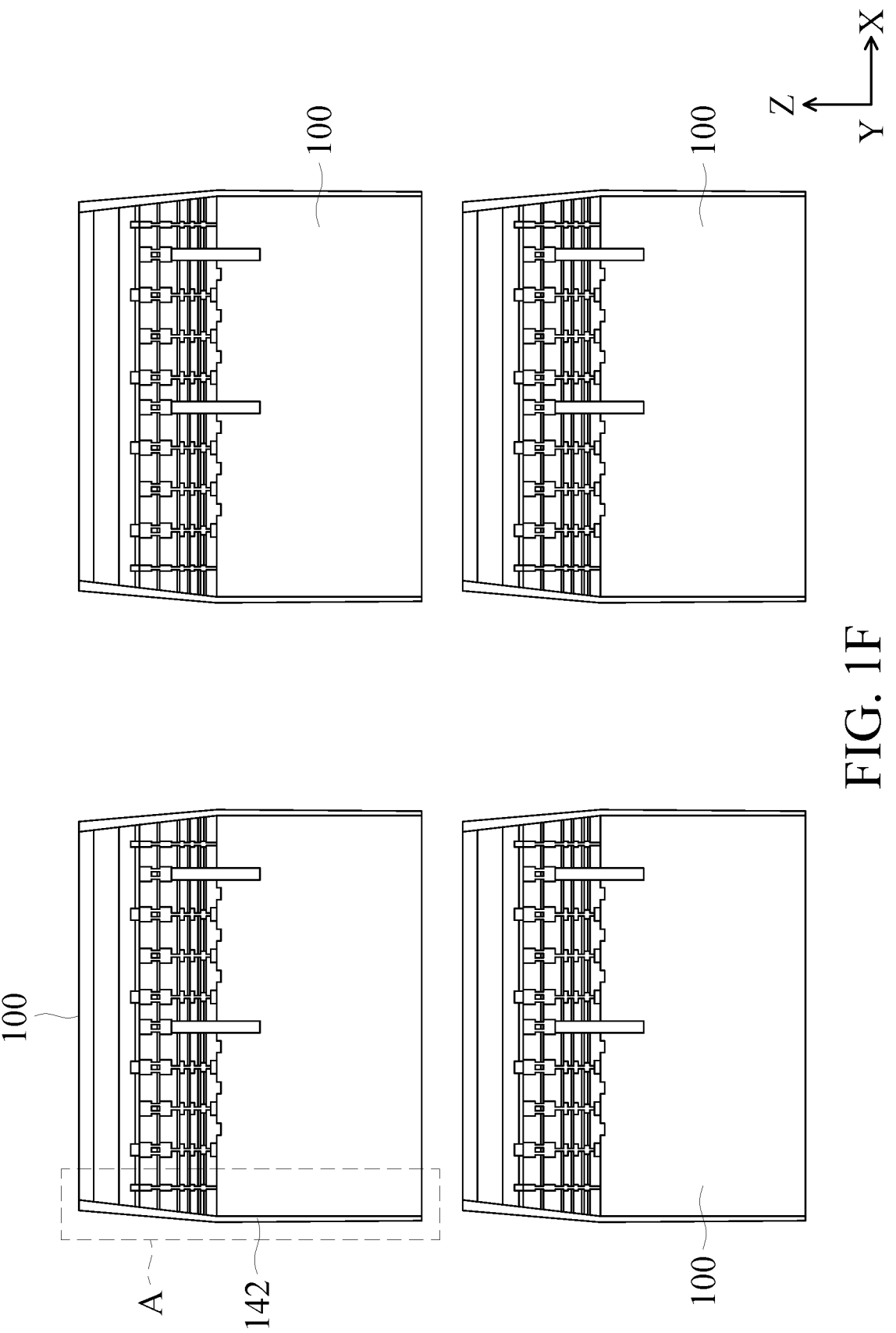
Figure 1G:
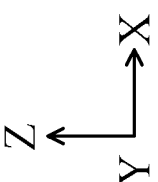
Figure 1G:
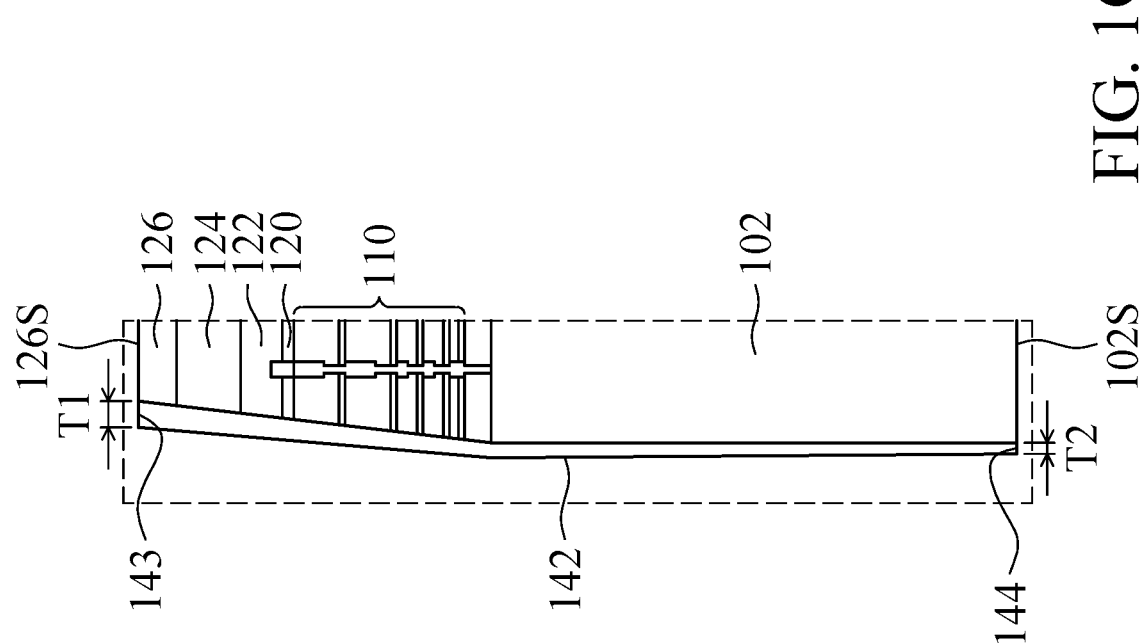

FIG. 1G is an enlarged view illustrating the region A shown in FIG. 1F in accordance with some embodiments. In some embodiments, the protective layer 142 has a curved profile, and the width of the protective layer varies along a vertical direction (e.g. the Z direction). In some embodiments, a top surface 143 of the protective layer 142 is spaced apart from a bottom surface 144 of the protective layer 142. That is, the top surface 143 of the protective layer 142 is not overlapped with the bottom surface 144 of the protective layer 142 in the vertical direction (e.g. in a top view).

For example, the protective layer 142 has a first width T1 that is parallel to a first surface 126S of the bonding film 126, and a second width T2 that is parallel to a second surface 102S of the semiconductor substrate 102. The first surface 126S is parallel to the second surface 102S, and the first width T1 is greater than the second width T2. In some embodiment, the first width T1 is the maximum width of the protective layer 142, and the second width T2 is the minimum width of the protective layer 142. The first width T1 and the second width T2 are measured in the same direction (e.g. the X direction). In some embodiment, the difference between the first width T1 and the second width T2 is from about 0.1% to about 10%. However, the present disclosure is not limited thereto. In some embodiment, the first width T1 and the second width T2 are substantially the same. In some embodiment, the first width T1 and the second width T2 are from about 10 Å to about 1000 Å. Accordingly, the protective layer 142 may provide protection for inner structure of the semiconductor from moisture or damage in the following processes.

Figure 1H:
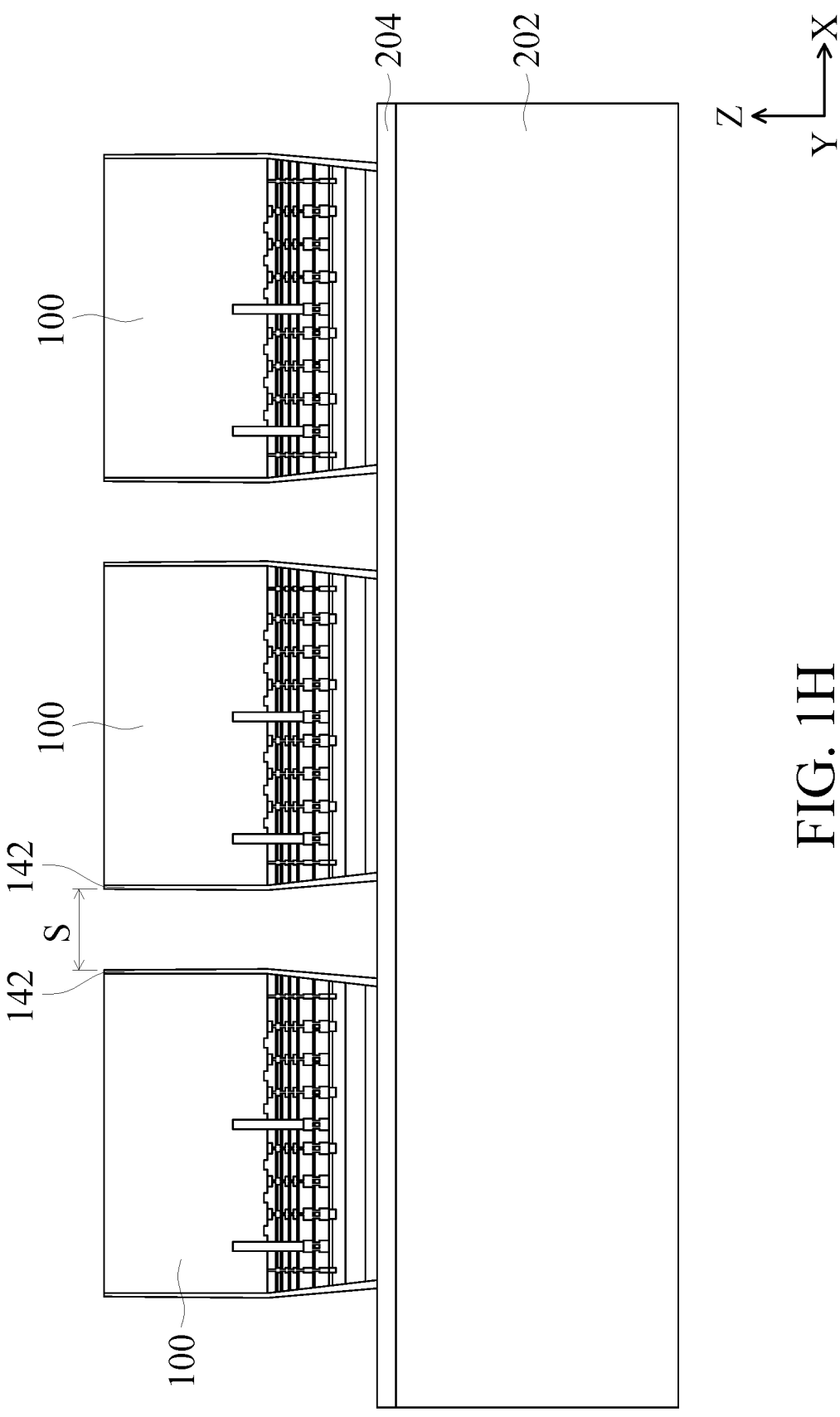

Next, as shown in FIG. 1H, multiple semiconductor dies 100 are bonded over a package substrate 202 to form a semiconductor package. In some embodiments, the semiconductor package may also be referred to as an integrated fan-out (InFO) package. However, the present disclosure is not limited thereto. In some embodiments, a bonding film 204 is formed on a front surface (e.g. the upper surface shown in FIG. 1H) of the package substrate 202 for bonding the semiconductor dies 100 (such as bonding with the bonding films 124 and 126 of the semiconductor dies 100). Accordingly, the protective layer 142 contacts and ends at a front surface (e.g. the upper surface shown in FIG. 1H) of the bonding film 204.

For example, the package substrate 202 includes doped or undoped silicon, or may be a semiconductor-on-insulator (SOI) substrate. In some embodiments, the package substrate 202 includes other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The material of the bonding film 204 includes SiON, $SiO_2$, any other suitable material, or a combination thereof. It is appreciated that the semiconductor dies 100 are, for example, made by the previous discussed processed. However, any other semiconductor die may also be packaged in the present process.

In some embodiments, the semiconductor dies 100 are spaced apart from each other, and the spacing S between the adjacent semiconductor dies 100 is not less than 15 μm. Accordingly, the subsequently formed dielectric material 150 (e.g. shown in FIG. 1J) may be filled between the semiconductor dies 100 more smoothly. For example, the spacing S is measured as the minimum distance between the opposite protective layers 142 (i.e. the protective layers 142 on adjacent semiconductor dies 100 that face each other).

Figure 1I:
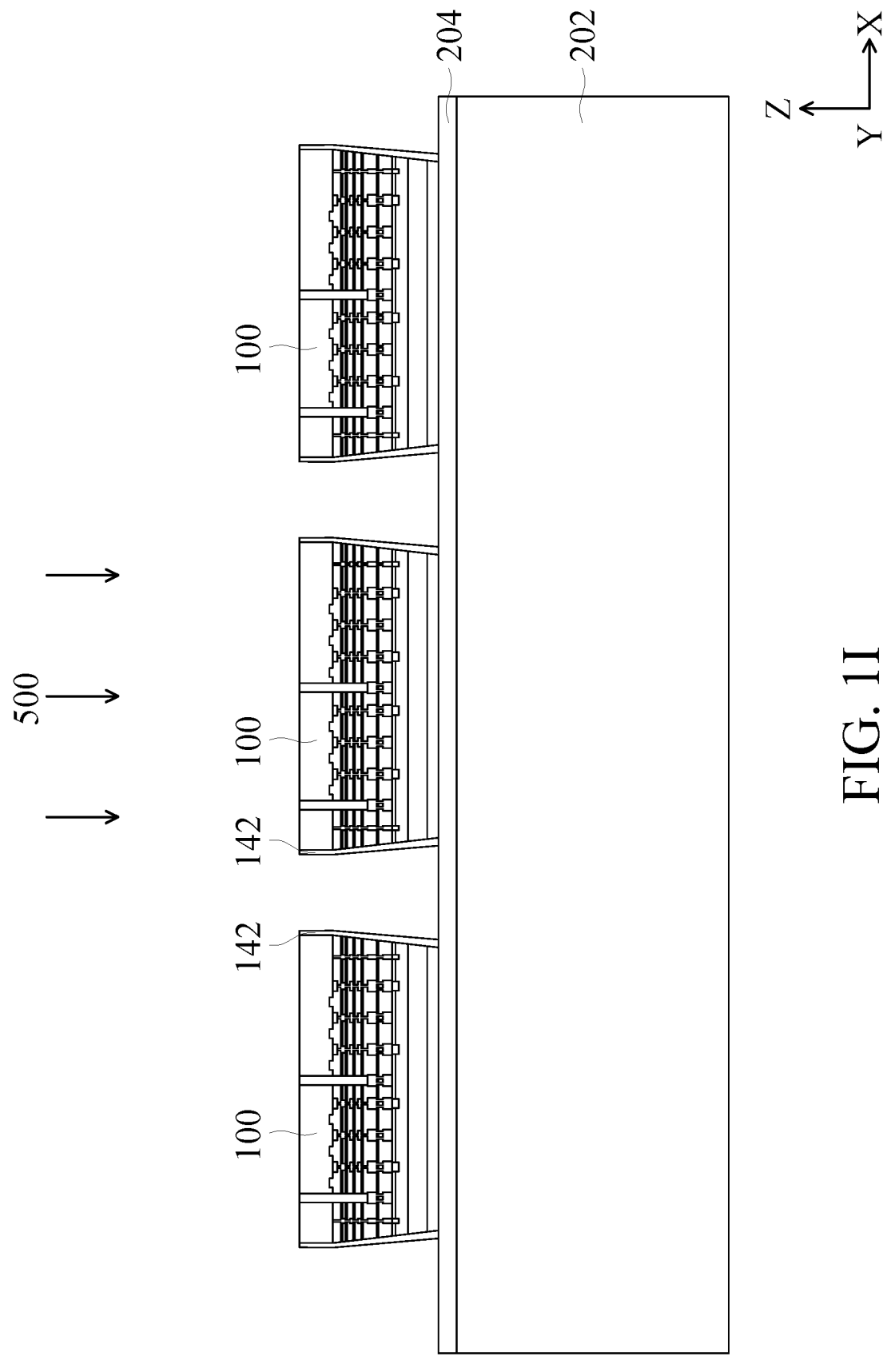

Next, as shown in FIG. 1I, a thin-down process 500 may be performed to the semiconductor dies 100. In some embodiments, the thin-down process 500 may be a polishing process or any other suitable process. The semiconductor substrate 102 may be thinned down until the TSVs 103 are exposed. Therefore, the interconnect structure 110 may be electrically connected to the external environment (e.g. another semiconductor die or external devices) via the TSVs 103.

Figure 1J:
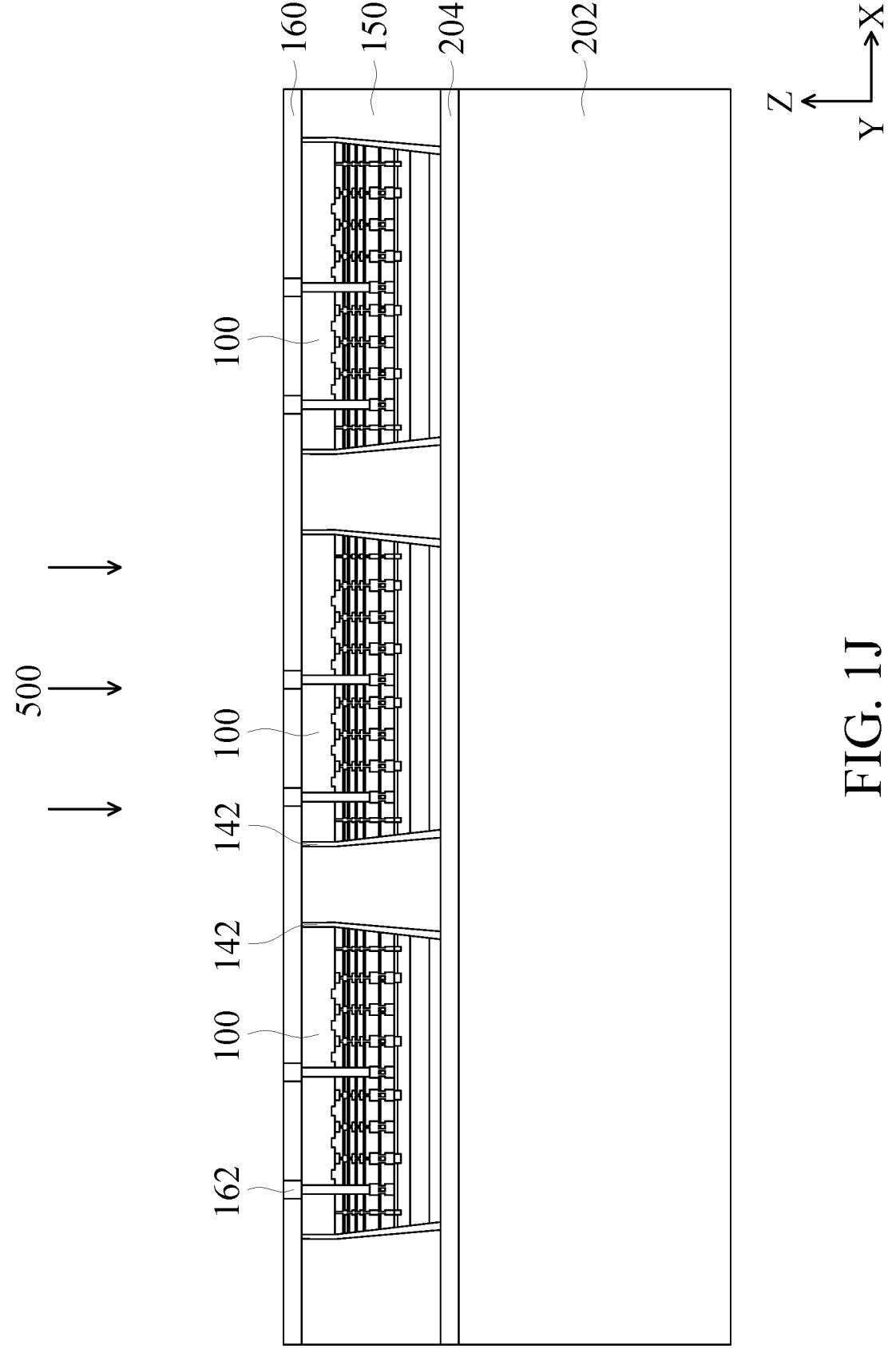

Then, as shown in FIG. 1J, the dielectric material 150 is filled between the semiconductor dies 100 and sandwiched by the protective layers 142. The dielectric material 150 is formed on sidewalls of the protective layers 142. Accordingly, the protective layers 142 are each in contact with one of the semiconductor dies 100 and the dielectric material 150. In some embodiments, the dielectric material 150 is filled to fit the profile of the protective material. In some embodiments, the dielectric material 150 overlaps with the protective layer 142 in a vertical direction (e.g. in a top view). In some embodiments, a passivation layer 160 is formed over the semiconductor dies 100 and the dielectric material 150, and a plurality of conductive pads 162 are formed in the passivation layer 160 and electrically connected to the TSVs 103. For example, the passivation layer 160 includes passivation material such as SiN, USG, SiO$_2$, any suitable material, or a combination thereof. The conductive pads 162 include conductive material such as tungsten (W), cobalt (Co), nickel (Ni), copper (Cu), silver (Ag), gold (Au), aluminum (Al), any other suitable conductive material, or a combination thereof.

Figure 1K:
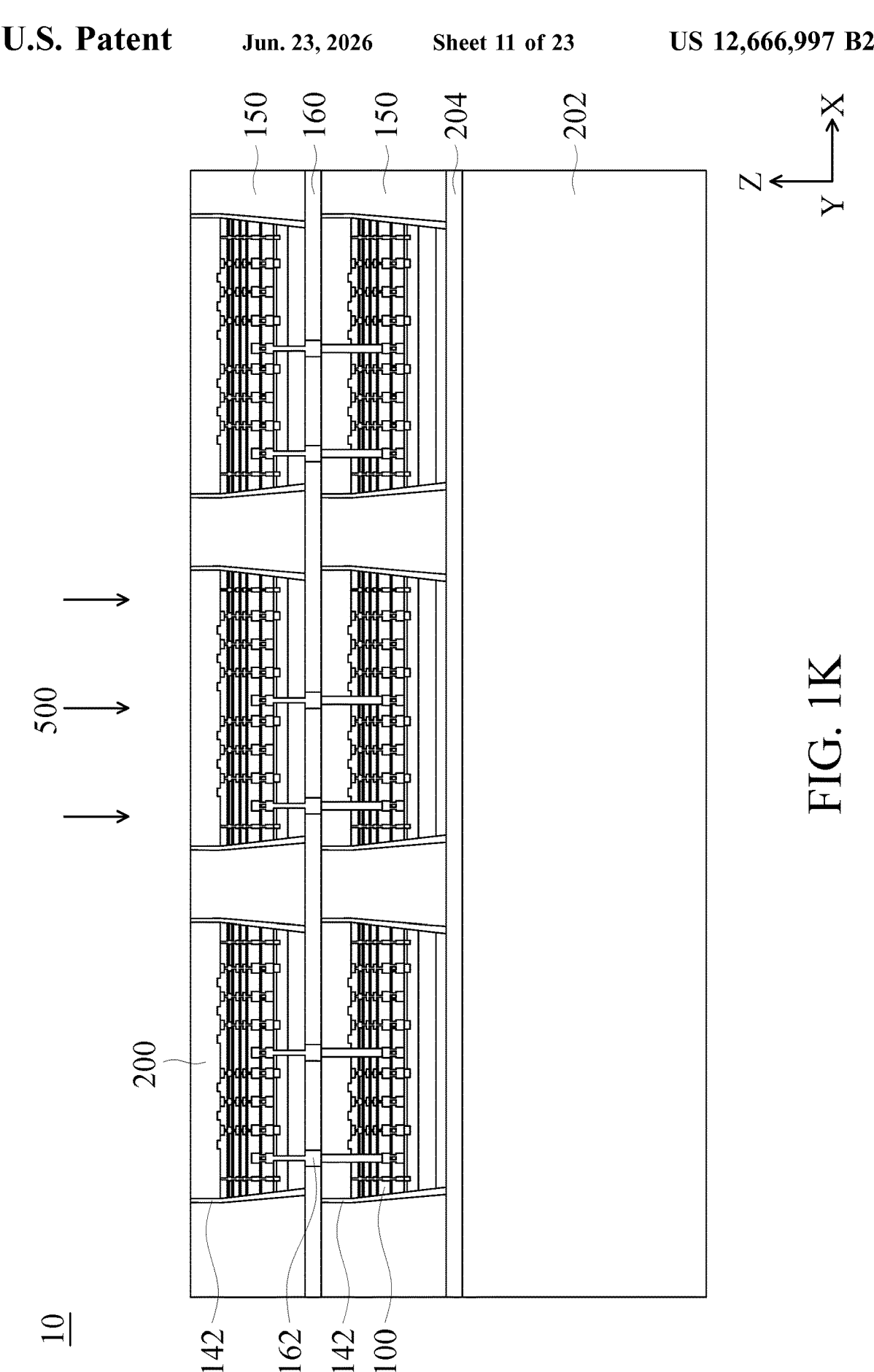

Then, as shown in FIG. 1K, another plurality of semiconductor dies 200 are disposed over and electrically connected to the semiconductor dies 100. In some embodiments, the semiconductor dies 200 are electrically connected to the semiconductor dies 100 via the conductive pads 162. The formation of the semiconductor dies 200 will be discussed in the following paragraphs. Similarly, the dielectric material 150 is also filled between the semiconductor dies 200, forming the semiconductor package 10. It should be appreciated that the semiconductor package 10 may include other structures and/or components that are not illustrated in the present embodiment, as long as the structures and/or components do not depart from the scope of the present disclosure.

FIGS. 2A-2J are perspective views illustrating various stages of forming a semiconductor package 20 in accordance with some embodiments. It should be noted that the semiconductor package 20 in the present embodiment may include the same or corresponding elements/structures as the semiconductor package 10 shown in FIG. 1A-1K. These elements/structures will be labeled with the same numerals, and will not be discussed in detail in the following paragraphs.

Figure 2A:
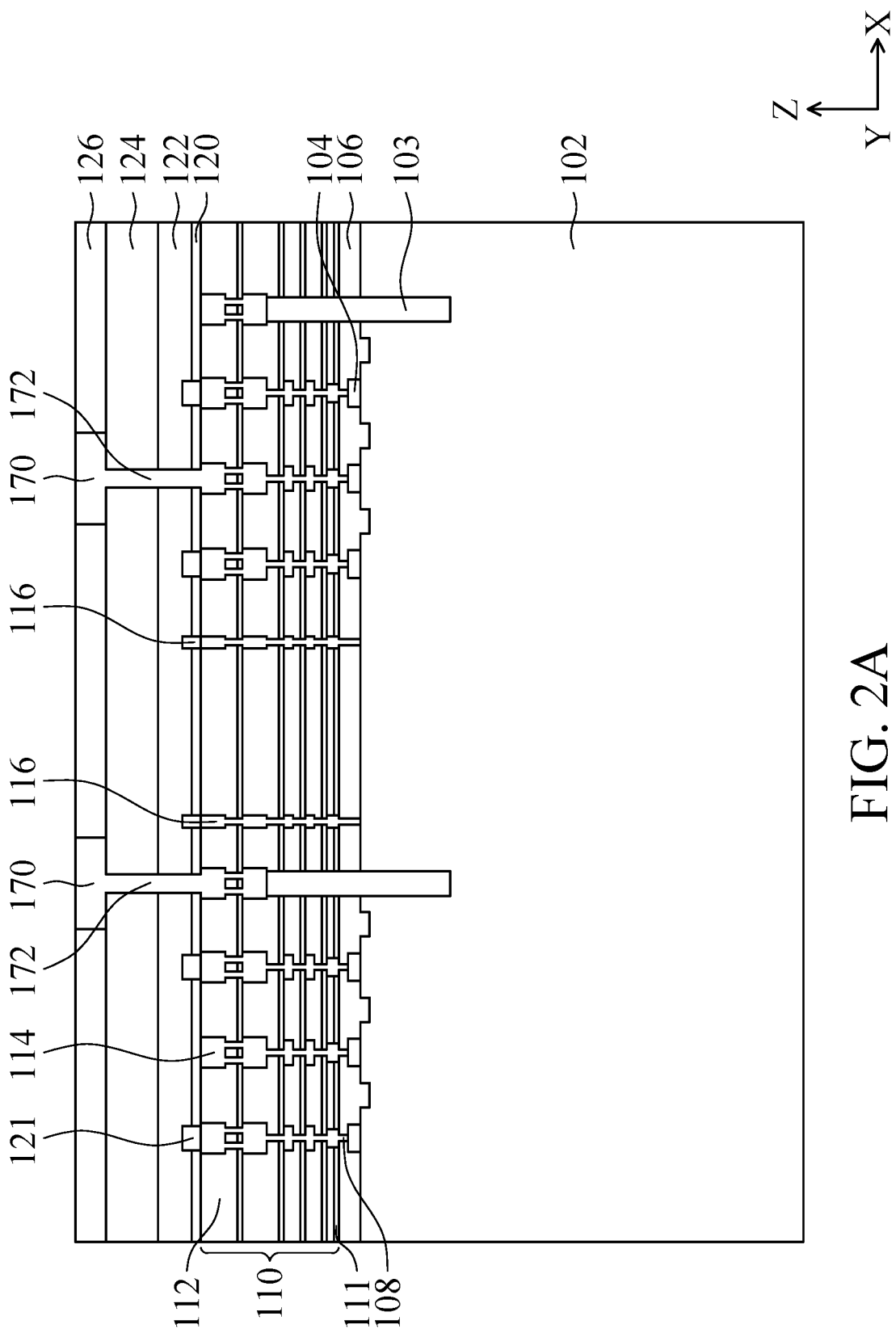
FIGS. 2A-2J are cross-sectional views illustrating various stages of forming a semiconductor package in accordance with some embodiments.

As shown in FIG. 2A, in some embodiments, a semiconductor die 200 is formed in a wafer, which may include different device regions that are singulated in subsequent steps to form a plurality of semiconductor dies. For example, the semiconductor die 200 includes a semiconductor substrate 102, and devices 104 are formed at the front side of the semiconductor substrate 102. An inter-layer dielectric (ILD) 106 is over the front side of the semiconductor substrate 102. In some embodiments, the ILD 106 surrounds and may cover the devices 104.

In some embodiments, conductive plugs 108 extend through the ILD 106 to electrically and physically couple the devices 104. An interconnect structure 110 is over the ILD 106 and conductive plugs 108. The interconnect structure 110 interconnects the devices 104 to form an integrated circuit. In some embodiments, a plurality of through-silicon vias (TSVs) 103 are formed through the semiconductor substrate 102 and extend into the interconnect structure 110. In some embodiments, the TSVs 103 are electrically connected to the interconnect structure 110 for forming a conductive path connected to external environment (e.g. another semiconductor die or external devices).

The semiconductor die 100 further includes pads 121, such as aluminum pads, copper pads, etc., to which external connections are made. The pads 121 are on the active side of the semiconductor die 100, such as in and/or on the interconnect structure 110. One or more passivation films 120 are on the semiconductor die 100, such as on portions of the interconnect structure 110 and pads 121. Openings extend through the passivation films 120 to the pads 121. A dielectric layer 122 may (or may not) be on the active side of the semiconductor die 100, such as on the passivation films 120. In some embodiments, the dielectric layer 122 may bury the pads 121, such that the topmost surface of the dielectric layer 122 is above the topmost surfaces of the pads 121. In some embodiments, a plurality of bonding films 124 and 126 are formed over the interconnect structure 110 and the dielectric layer 122 and provided for subsequent bonding process.

As shown in FIG. 2A, conductive pads 170 are formed in the bonding film 126, and conductive plugs 172 are formed below the conductive pads 170. In some embodiments, the conductive pads 170 are each electrically connected to the interconnect structure 110 and the TSVs 103 via the conductive plugs 172, which pass through the bonding film 124, the dielectric layer 122 and the passivation films 120. For example, the conductive pads 170 and the conductive plugs 172 include conductive material such as tungsten (W), cobalt (Co), nickel (Ni), copper (Cu), silver (Ag), gold (Au), aluminum (Al), any other suitable conductive material, or a combination thereof. In some embodiments, the conductive pads 170 and the conductive plugs 172 are formed by, for example, plating, or the like. The conductive pads 170 and the conductive plugs 172 electrically couple the respective integrated circuits of the semiconductor die 100.

Figure 2B:
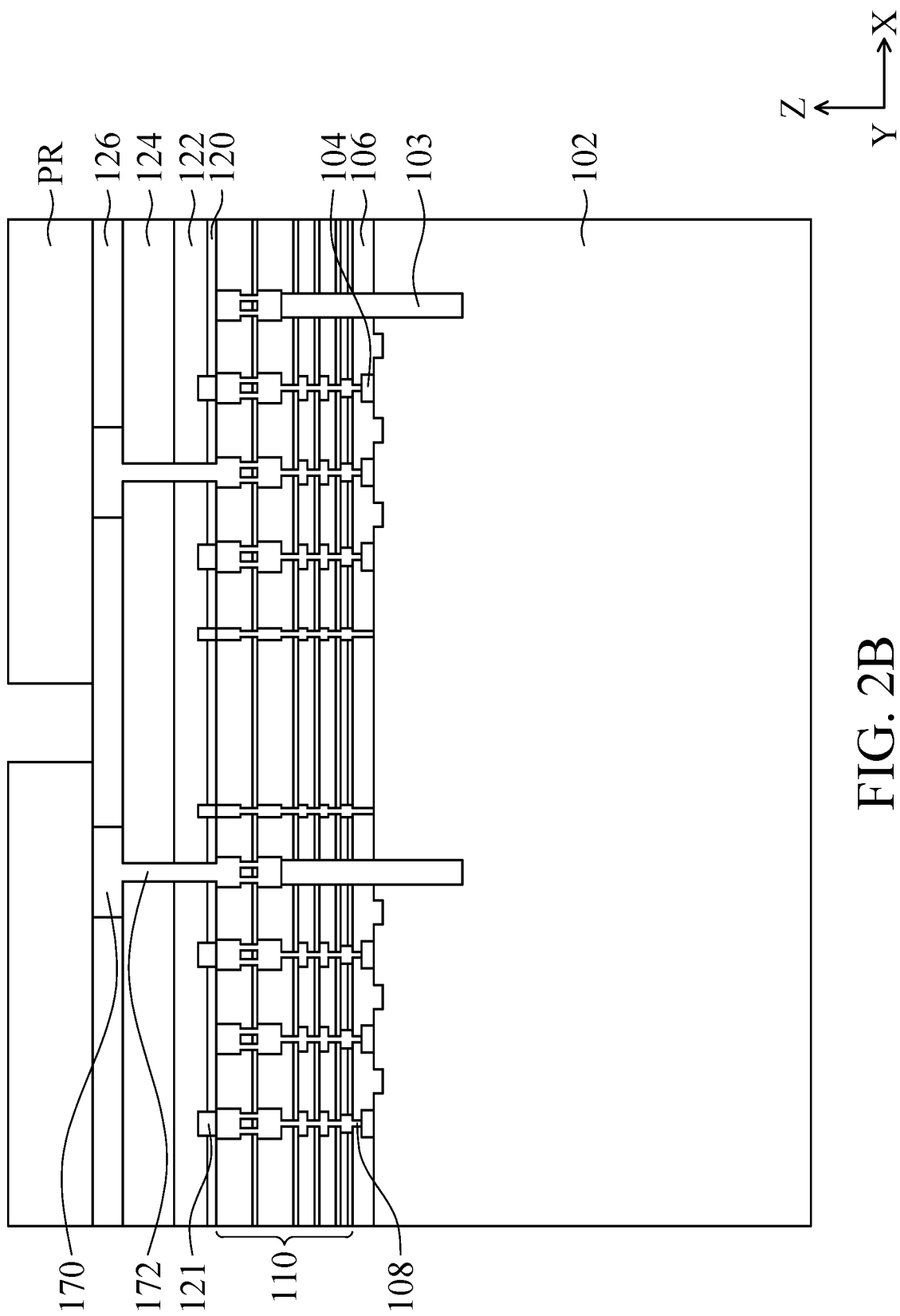
Figure 2C:
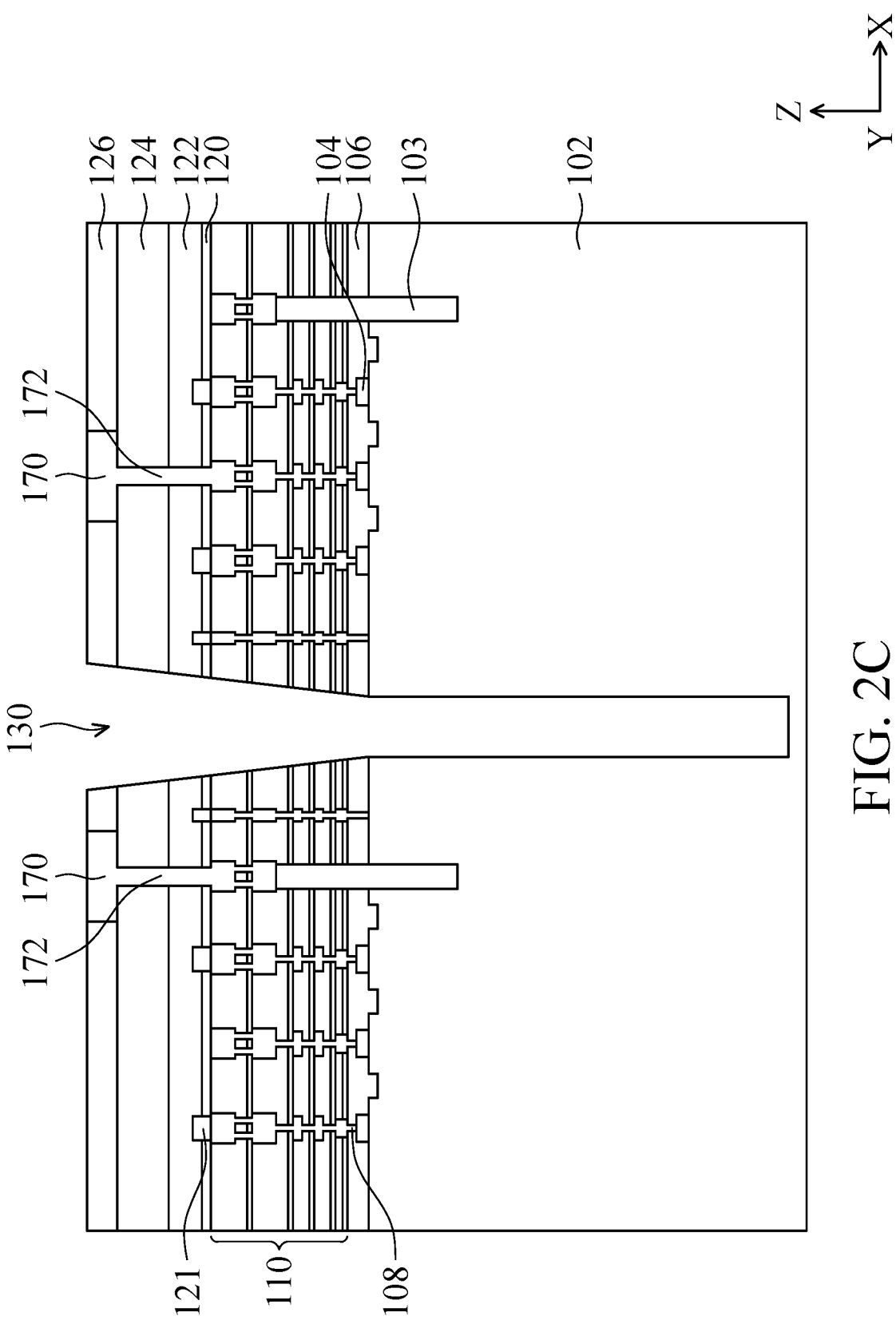

As shown in FIG. 2B, a patterned photoresist layer PR is formed over the bonding films 124 and 126. The patterned photoresist layer PR may be formed by a deposition process and a patterning process. In some embodiments, the patterned photoresist layer PR covers the conductive pads 170 to protect the conductive pads 170 from the subsequent etching process. Then, as shown in FIG. 2C, an opening 130 may be formed by performing an etching process, using the patterned photoresist layer 108 as a mask. The etching process may be a time-controlled process, and continue until the opening 130 extends from the second bonding film 126 to the semiconductor substrate 102. In some embodiments, the opening 130 does not fully penetrate the semiconductor substrate 102. In some other embodiments, the opening 130 has a width that gradually decreases from the top portion to the lower portion. Afterwards, the patterned photoresist layer PR is removed.

Figure 2D:
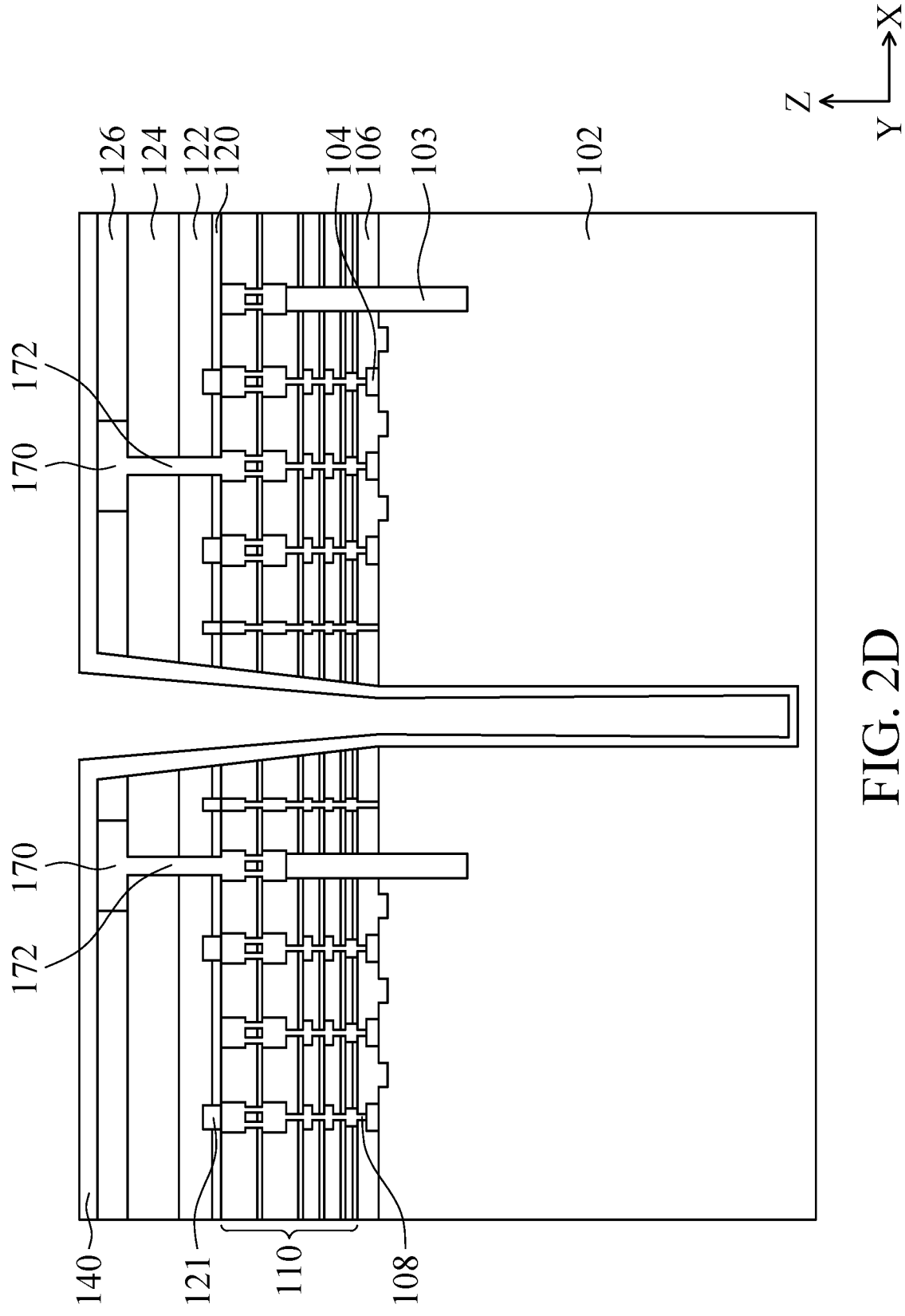

Next, as shown in FIG. 2D, a protective material 140 is formed over the semiconductor substrate 102. In some embodiments, the protective material 140 is deposited over the bonding film 126 and the conductive pads 170, and formed in the opening 130. Therefore the protective material 140 may be divided into a first portion 140A over the bonding film 126 and the conductive pads 170 and a second portion 140B in the opening 130. The second portion 140B continuously extends from the sidewall of the bonding films 124 and 126 to the sidewall of the semiconductor substrate 102. Accordingly, the second portion 140B covers the sidewalls of the bonding films 124 and 126, the interconnect structure 110, and the semiconductor substrate 102, and also covers a portion of the front surface of the semiconductor substrate 102. In some embodiments, the second portion 140B is formed with an inconsistent width since the opening 130 has a tapered shape. In some embodiments, the protective material 140 is conformally deposited over the lower structure, and therefor has a constant width (or thickness).

Figure 2E:
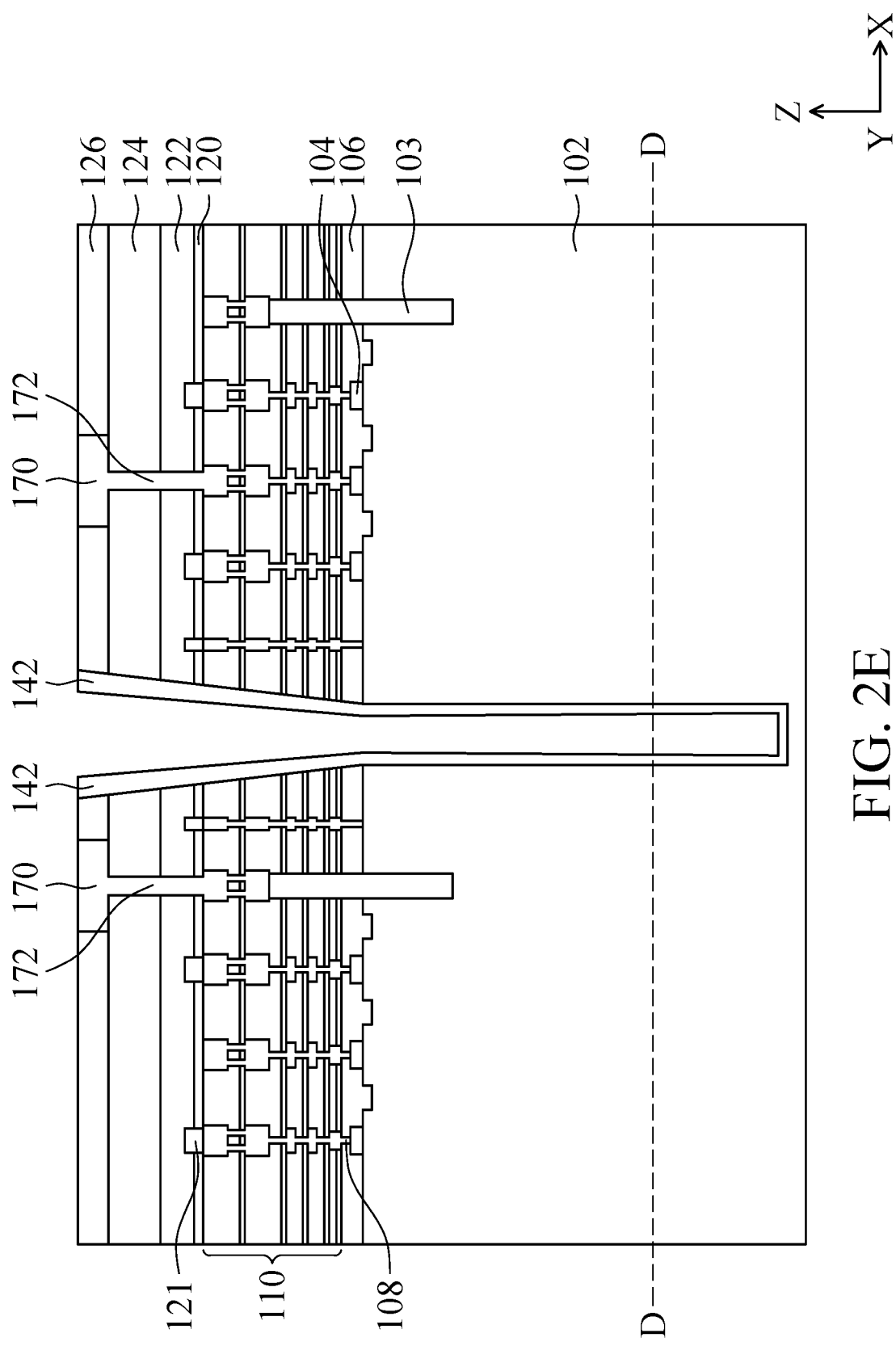
Figure 2F:
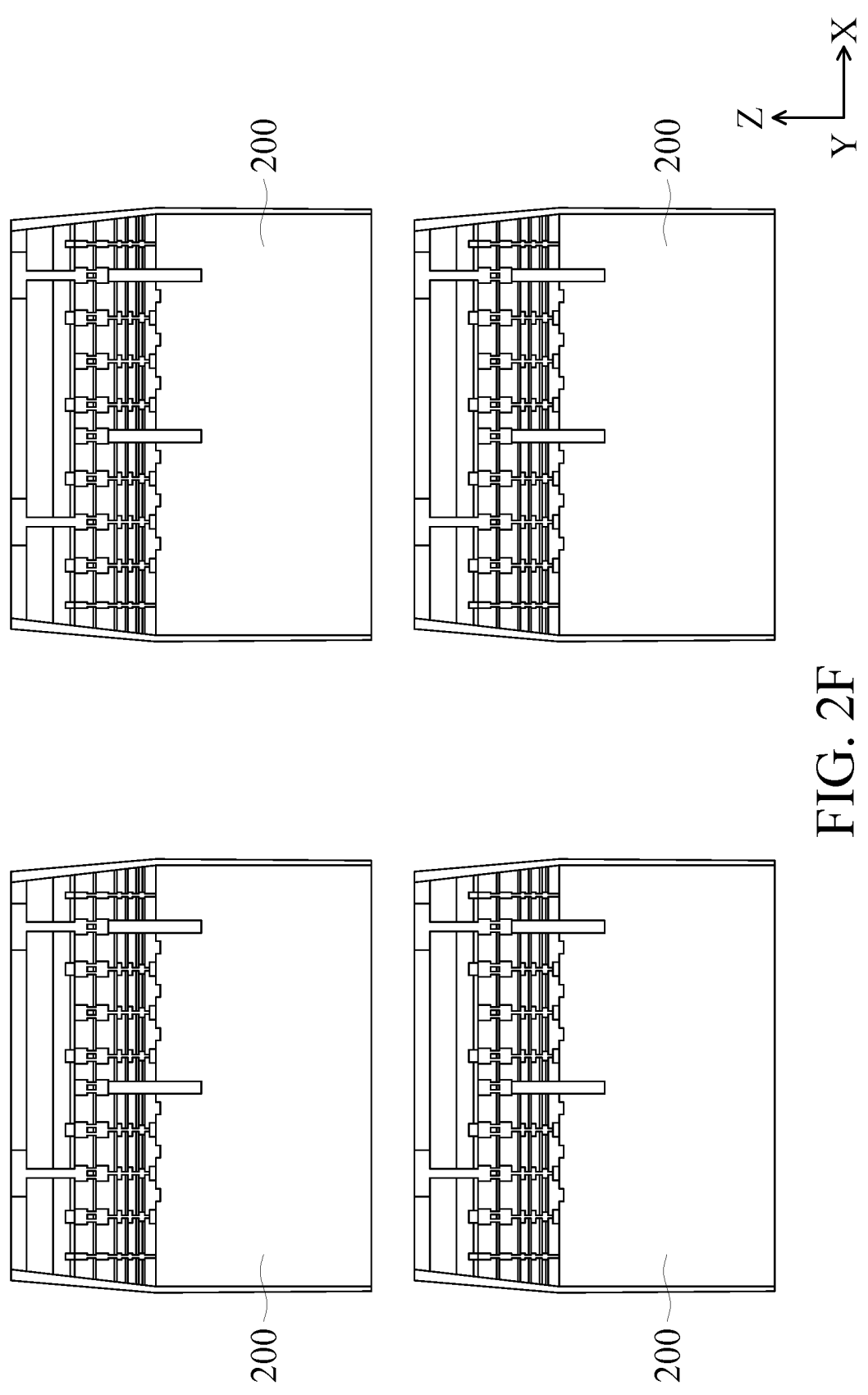

Then, as shown in FIG. 2E, the first portion 140A of the protective material 140 is removed, leaving the second portion 140B in the opening 130. In some embodiments, the first portion 140A is removed using an etch back process, and the top surface of the second portion 140B is substantially level with the top surfaces of the bonding film 126 and the conductive pads 170 after the first portion 140A is removed. However, the present disclosure is not limited thereto. Any other suitable planarization method (e.g. chemical mechanical polish (CMP) process) may also be adopted to remove the first portion 140A.

In some embodiments, a plurality of semiconductor dies 200 (see FIG. 2F) may be singulated by partially removing the semiconductor substrate 102 and the second portion 140B of the protective material 140. For example, a polishing process may be performed to the back side of the semiconductor substrate 102. In some embodiments, the polishing process is performed to remove the structure below the line D-D, for example, and therefore the semiconductor dies 200 may be singulated and a protective layer 142 is formed from the remaining second portion 140B of the protective material 140, in accordance with some embodiments shown in FIG. 2F. Accordingly, the protective layer 142 is formed on sidewalls of the semiconductor dies 200. In some embodiments, the conductive pads 170 are spaced apart from the protective layer 142.

Optionally, the CP testing is performed on the semiconductor die 200 to ascertain whether the semiconductor die 200 is a known good die (KGD). In some embodiments, only semiconductor dies 200, which are KGDs, undergo subsequent processing and are packaged, and dies, which fail the CP testing, are not packaged. After testing, the solder regions may be removed in subsequent processing steps.

Figure 2G:
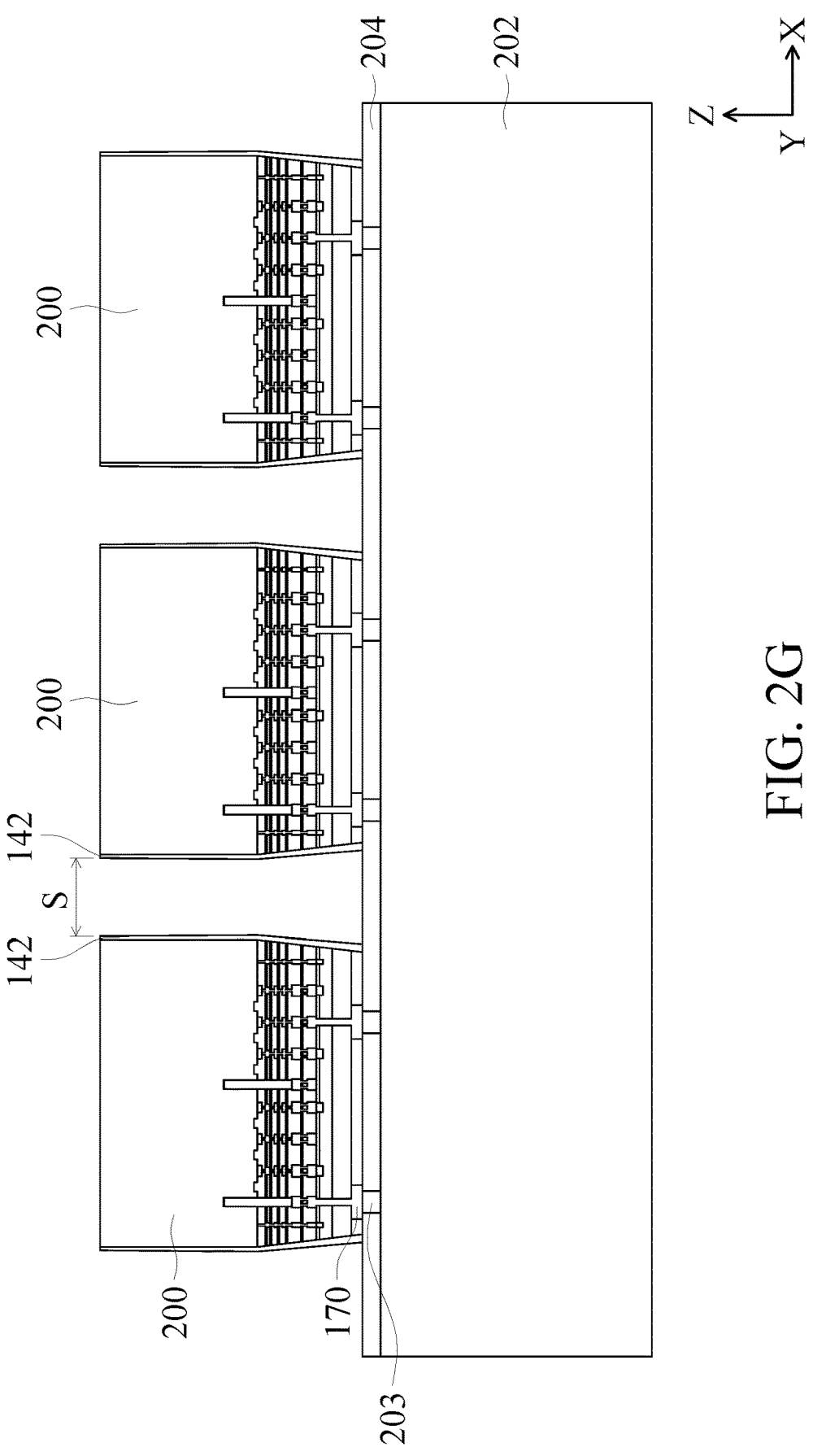

Next, as shown in FIG. 2G, multiple semiconductor dies 200 are bonded over a package substrate 202 to form a semiconductor package. In some embodiments, the semiconductor package may also be referred to as an integrated fan-out (InFO) package. However, the present disclosure is not limited thereto. In some embodiments, a bonding film 204 is formed on a front surface (e.g. the upper surface shown in FIG. 2G) of the package substrate 202 for bonding the semiconductor dies 200 (such as bonding with the bonding films 124 and 126 of the semiconductor dies 200). Accordingly, the protective layer 142 contacts and ends at a front surface (e.g. the upper surface shown in FIG. 2G) of the bonding film 204. In some embodiments, the conductive pads 170 are each disposed on and electrically connected to pads 203 that are formed on the package substrate 202. The pads 203 are formed in the bonding film 204 and connected to circuit structure (not shown) in the package substrate 202.

In some embodiments, the semiconductor dies 200 are spaced apart from each other, and the spacing S between the adjacent semiconductor dies 200 is not less than 15 μm. Accordingly, the subsequently formed dielectric material 150 (e.g. shown in FIG. 2I) may be filled between semiconductor dies 200 more smoothly. For example, the spacing S is measured as the minimum distance between the opposite protective layers 142 (i.e. the protective layers 142 on adjacent semiconductor dies 200 that face each other).

Figure 2H:
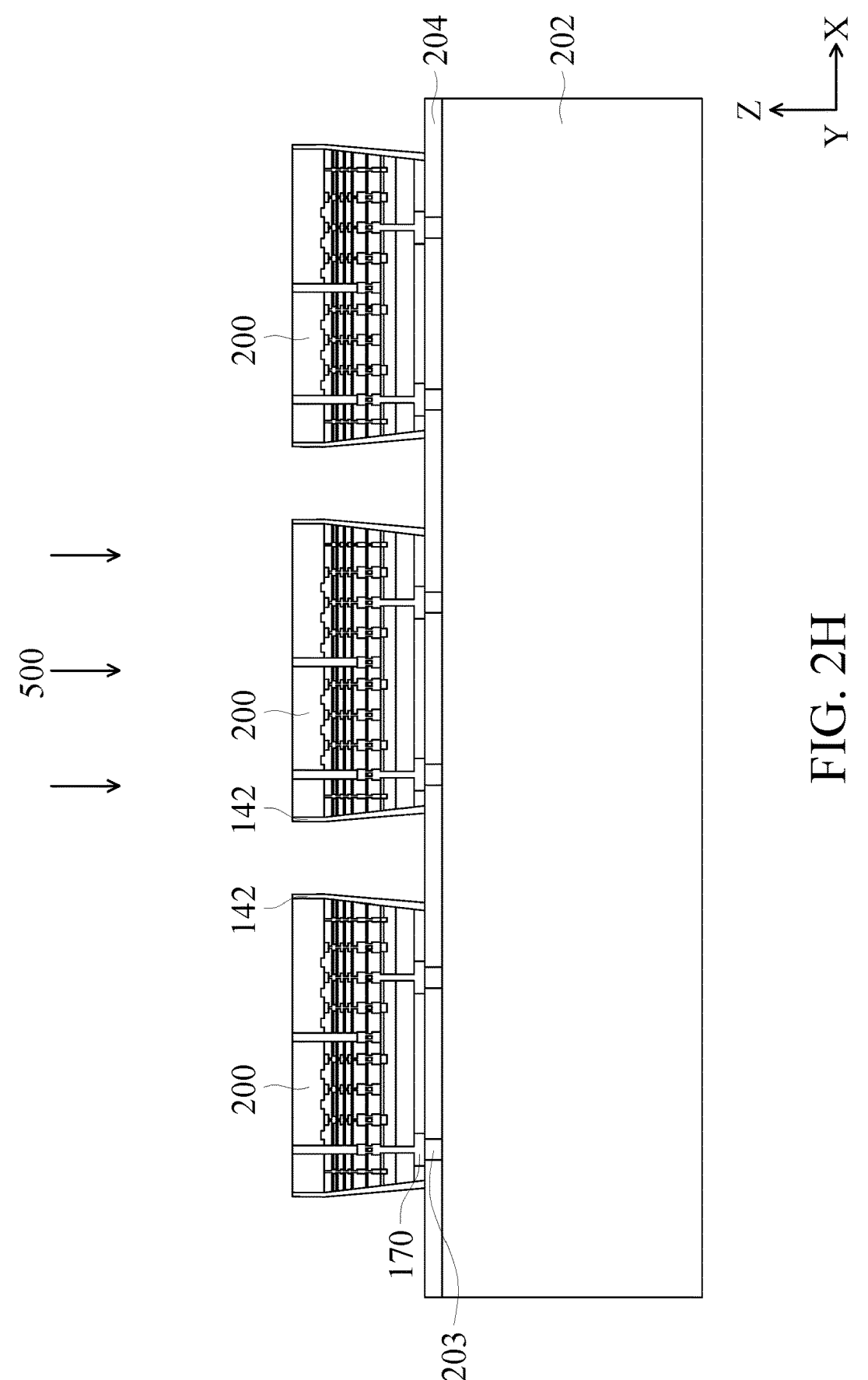

Next, as shown in FIG. 2H, a thin-down process 500 may be performed to the semiconductor dies 200. In some embodiments, the thin-down process 500 may be a polishing process or any other suitable process. The semiconductor substrate 102 may be thinned down until the TSVs 103 are exposed. Therefore, the interconnect structure 110 may be electrically connected to the external environment (e.g. another semiconductor die or external devices) via the TSVs 103.

Figure 2I:
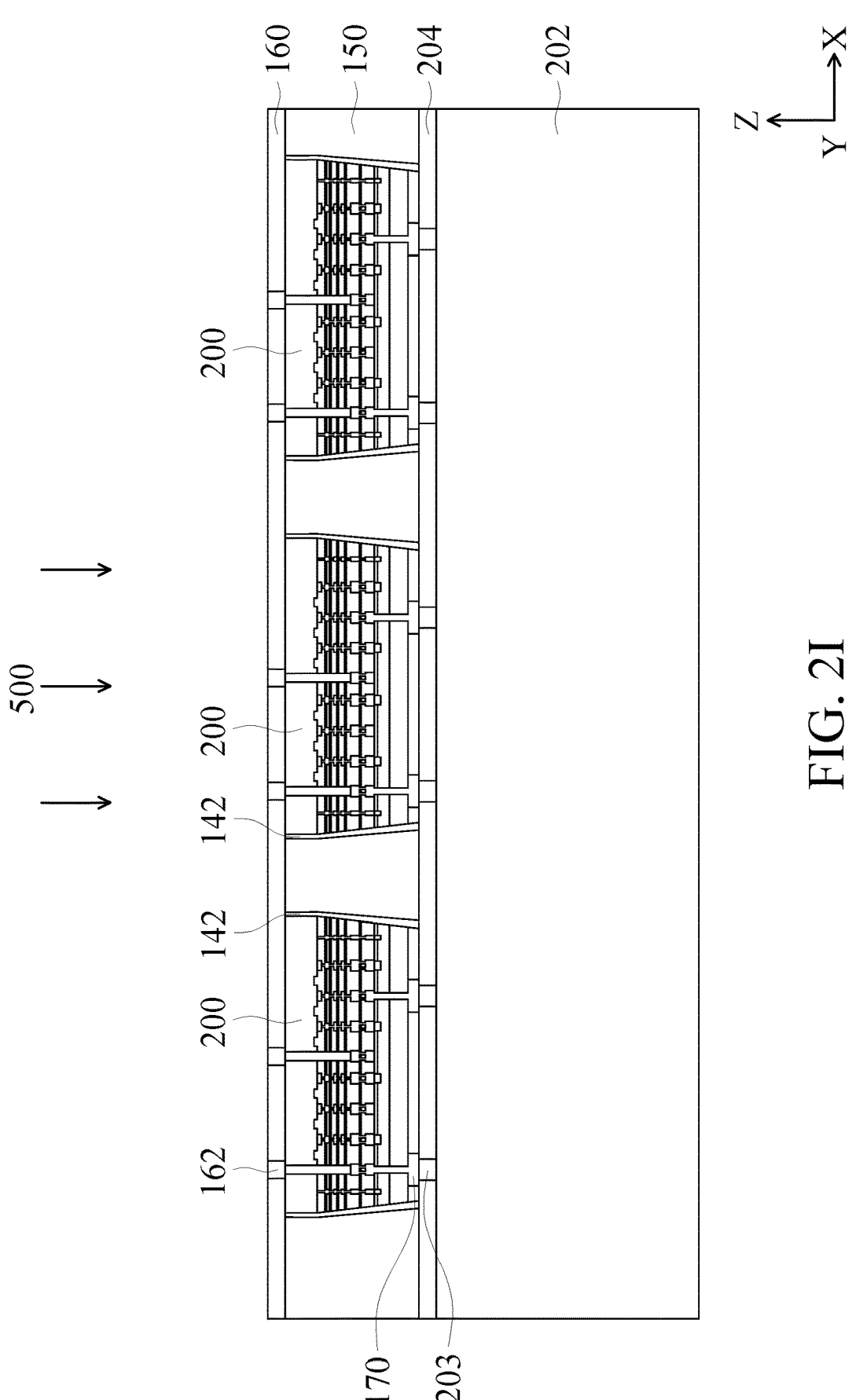

Then, as shown in FIG. 2I, the dielectric material 150 is filled between the semiconductor dies 200 and sandwiched by the protective layers 142. Accordingly, the protective layers 142 are each in contact with one of the semiconductor dies 200 and the dielectric material 150. In some embodiments, the dielectric material 150 is filled to fit the profile of the protective material. In some embodiments, a passivation layer 160 is formed over the semiconductor dies 100 and the dielectric material 150, and a plurality of conductive pads 162 are formed in the passivation layer 160 and electrically connected to the TSVs 103.

Figure 2J:
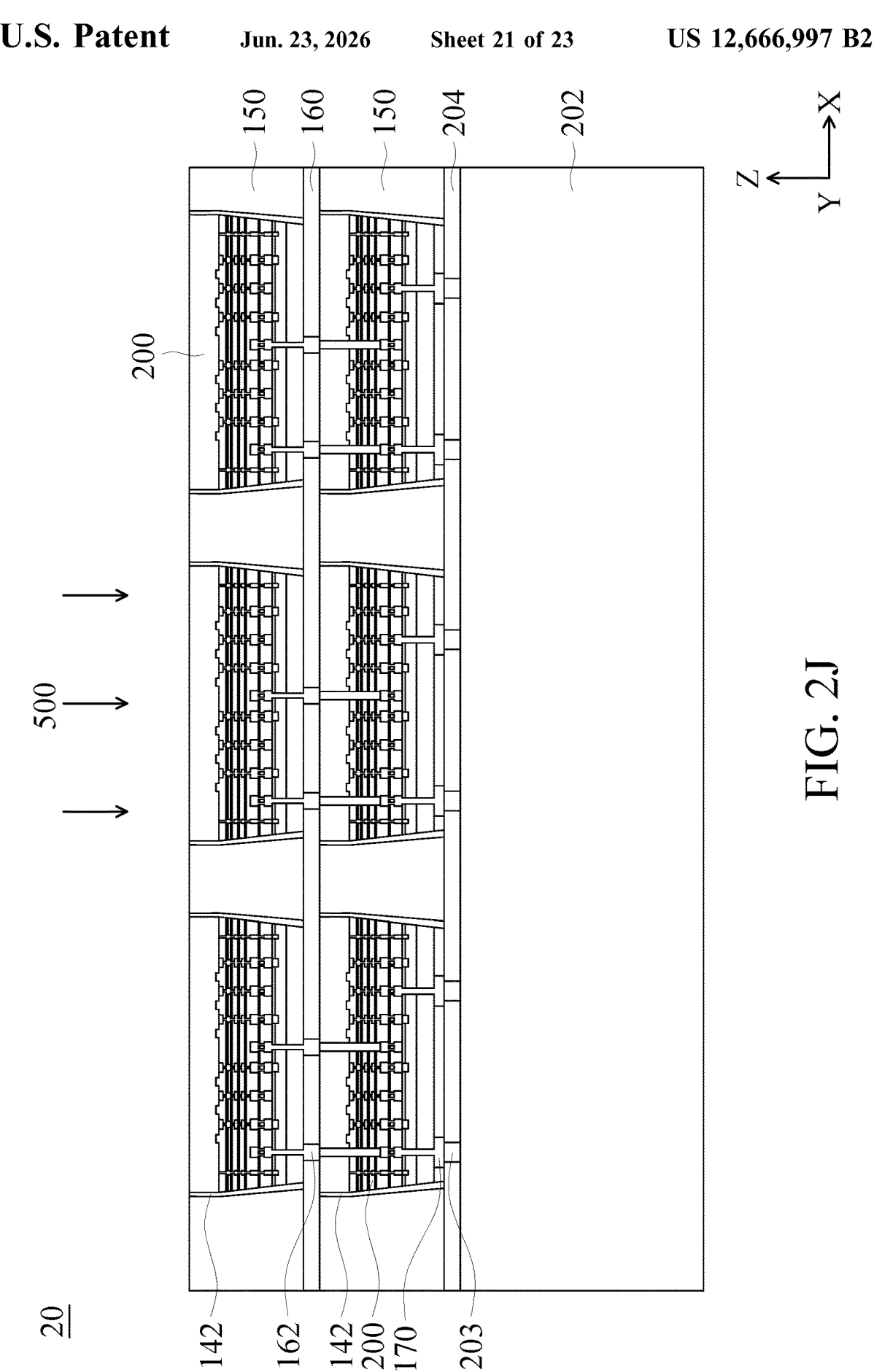

Then, as shown in FIG. 2J, another plurality of semiconductor dies 200 are disposed over and electrically connected to the lower semiconductor dies 200. In some embodiments, the upper semiconductor dies 200 are electrically connected to the lower semiconductor dies 200 via the conductive pads 162. Similarly, the dielectric material 150 is also filled between the upper semiconductor dies 200, forming the semiconductor package 20. It should be appreciated that the semiconductor package 20 may include other structures and/or components that are not illustrated in the present embodiment, as long as the structures and/or components do not depart from the scope of the present disclosure.

Figure 3:
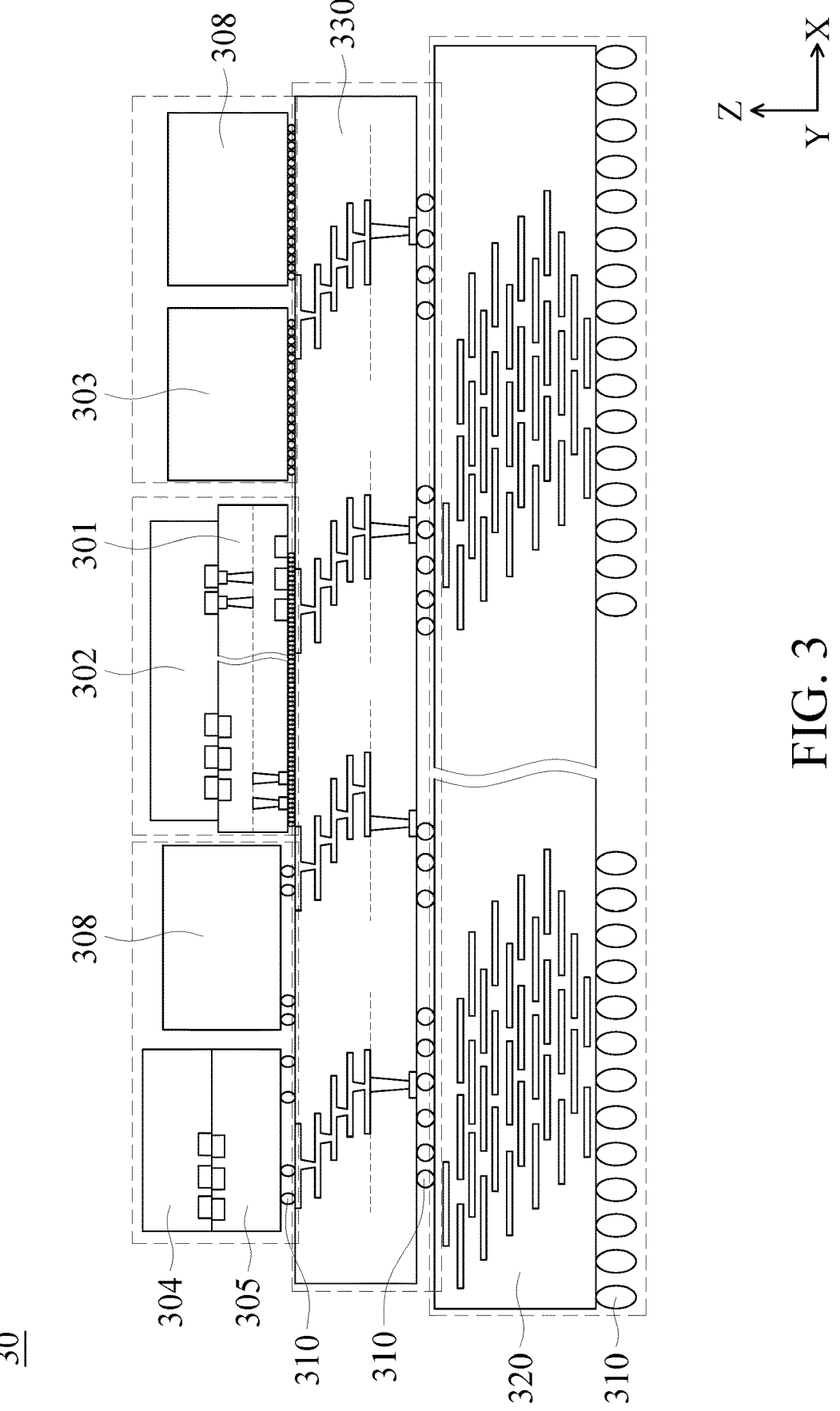
FIG. 3 is a cross-sectional view illustrating the semiconductor package in accordance with some embodiments.

FIG. 3 is a cross-sectional view illustrating the semiconductor package 30 in accordance with some embodiments. As shown in FIG. 3, the semiconductor package 30 includes a plurality of semiconductor dies 301, 302, 303, 304, and 305, one or more electronic components 308, bump structures 310, a circuit board 320, and an interposer 330. The circuit board 320 and the interposer 330 may include multiple layers of dielectric and conductive structures. The circuit board 320 and the interposer 330 may be made by the similar method as the interconnect structure 110. However, the present disclosure is not limited thereto. For example, the interposer 330 may be a chip-on-wafer-on-substrate (CoWoS) structure. The electronic components 308 each may be a memory device such as a hybrid memory cube (HMC) module, a high bandwidth memory (HBM) module, or the like.

It should be appreciated that the semiconductor dies 301, 302, 303, 304, and 305 may each be either of the semiconductor dies 100 or 200 as discussed above, and the detailed structure of these semiconductor dies 301, 302, 303, 304, and 305 will not be repeated again. In some embodiments, the semiconductor dies 301, 302, 303, 304, and 305 and the electronic components 308 are bonded to the interposer 330 via the bump structures 310. In some embodiments, the interposer 330 is further bonded to the circuit board 320 via the bump structures 310. In some embodiments, the bump structures 310 may be controlled collapse chip connection (C4) bumps, conductive ball structures (such as ball grid array (BGA)), conductive pillar structures, conductive paste structures, or any conductive structure that are mounted on and electrically coupled to components to be bonded in the bonding process.

In some embodiments, the semiconductor dies may be vertically stacked, such as the semiconductor dies 301 and 302. In some embodiments, the semiconductor dies may be bonded adjacent to the electronic component 308, such as the semiconductor die 303. In some embodiments, the vertically stacked semiconductor dies may be bonded adjacent to the electronic component 308, such as the semiconductor dies 304 and 305. These configurations of the semiconductor dies serve as examples, and based on the present disclosure, those skilled in the art would adopt one or more configurations as required.

Figure 4:
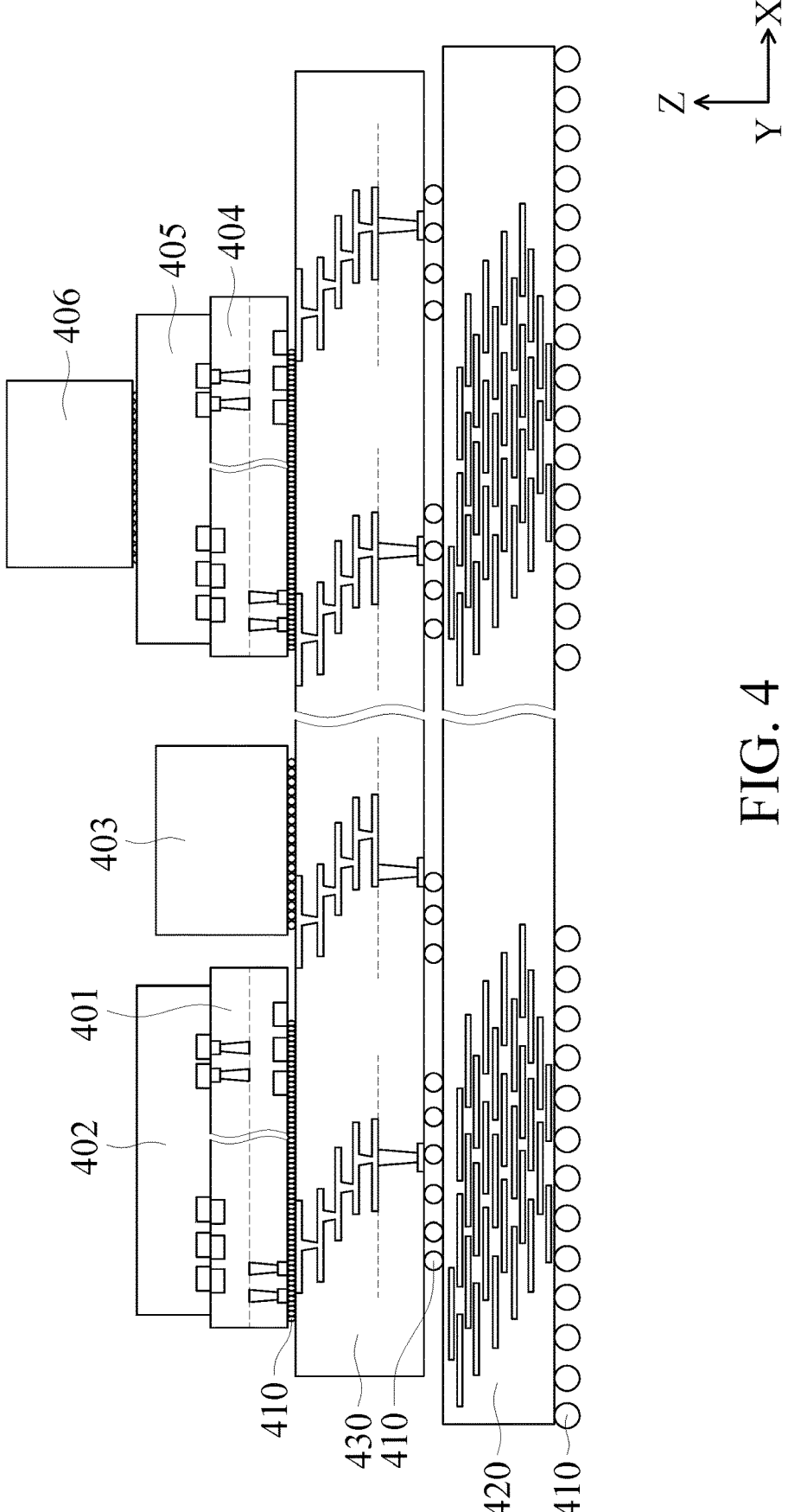
FIG. 4 is a cross-sectional view illustrating the semiconductor package in accordance with some embodiments.

FIG. 4 is a cross-sectional view illustrating the semiconductor package 40 in accordance with some embodiments. As shown in FIG. 4, the semiconductor package 40 includes a plurality of semiconductor dies 401, 402, 403, 404, 405, and 406, bump structures 410, a circuit board 420, and an interposer 430. The circuit board 420 and the interposer 430 may include multiple layers of dielectric and conductive structures. The circuit board 420 and the interposer 430 may be made by the similar method as the interconnect structure 110. However, the present disclosure is not limited thereto. For example, the interposer 430 may be a Chip On Wafer On Substrate (CoWoS) structure.

It should be appreciated that the semiconductor dies 401, 402, 403, 404, 405, and 406 may each be either of the semiconductor dies 100 or 200 as discussed above, and the detailed structure of these semiconductor dies 401, 402, 403, 404, 405, and 406 will not be repeated again. In some embodiments, the vertically stacked semiconductor dies 401 and 402 may be located at an edge of the semiconductor package 40. Otherwise, the vertically stacked semiconductor dies 401 and 402 may be located at a central region of the semiconductor package 40. In some embodiments, the semiconductor dies 404 and 405 are vertically stacked on the interposer 430, and another semiconductor die 406 is further vertically bonded onto the vertically stacked semiconductor dies 404 and 405. These configurations of the semiconductor dies serve as examples, and based on the present disclosure, those skilled in the art would adopt one or more configurations as required.

As described above, the present disclosure is directed to semiconductor structures and methods for forming the same are provided. The semiconductor structure includes a protective layer formed on sidewalls of each semiconductor die. The protective layer provides protection from the gap-filled dielectric material or moisture for the inner structure of the semiconductor dies. Accordingly, cracks would be reduced on sidewalls of each semiconductor die while filling the dielectric material between the semiconductor dies.

In accordance with some embodiments, a semiconductor structure includes: a substrate and a plurality of devices disposed over the substrate. The semiconductor structure includes an interconnect structure disposed over the substrate and electronically connected to the devices. The semiconductor structure also includes a bonding film formed over the interconnect structure. The semiconductor structure further includes a protective layer formed on sidewalls of the substrate, the interconnect structure and the bonding film. In addition, the semiconductor structure includes a dielectric material formed on a sidewall of the protective layer and overlapping with the protective layer in a top view.

In accordance with some embodiments, a semiconductor package includes a package substrate and a plurality of first semiconductor dies disposed over the package substrate. The first semiconductor dies are spaced apart from each other. The semiconductor package also includes a protective layer formed on sidewalls of each of the first semiconductor dies. The semiconductor package further includes a dielectric material formed between adjacent two of the first semiconductor dies and sandwiched by the protective layer.

In accordance with some embodiments, a method of forming a semiconductor structure includes: disposing a plurality of devices over a substrate; and forming an interconnect structure over the substrate and the devices. The method also includes forming a bonding film over the interconnect structure; and etching the interconnect structure and the substrate to form an opening. The method further includes depositing a protective material over the substrate. The protective material has a first portion located over the bonding film and a second portion located in the opening. In addition, the method includes removing the first portion of the protective material; and singulating a plurality of semiconductor dies by partially removing the substrate and the second portion of the protective material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a plurality of devices disposed over the substrate;
an interconnect structure disposed over the substrate and electronically connected to the devices;
a bonding film formed over the interconnect structure;
a protective layer formed on sidewalls of the substrate, the interconnect structure and the bonding film, wherein a width of the protective layer gradually increases away from the substrate on the sidewalls of the bonding film along a vertical direction; and
a dielectric material formed on a sidewall of the protective layer and overlapping with the protective layer in a top view.

2. The semiconductor structure as claimed in claim 1, wherein the protective layer has a first width parallel to a first surface of the bonding film, the protective layer has a second width parallel to a second surface of the substrate, the first surface is parallel to the second surface, and the first width is greater than the second width.

3. The semiconductor structure as claimed in claim 2, wherein a difference between the first width and the second width is from 0.1% to 10%.

4. The semiconductor structure as claimed in claim 1, wherein the width of the protective layer is from 10Å to 1000 Å.

5. The semiconductor structure as claimed in claim 1, wherein the protective layer continuously extends from the sidewall of the substrate to the sidewall of the bonding film.

6. The semiconductor structure as claimed in claim 1, wherein a top surface of the protective layer is spaced apart from a bottom surface of the protective layer in the top view.

7. The semiconductor structure as claimed in claim 1, further comprising a conductive pad formed in the bonding film and electronically connected to the interconnect structure, wherein the conductive pad is spaced apart from the protective layer.

8. A semiconductor package, comprising:
a package substrate;
a plurality of first semiconductor dies disposed over the package substrate, wherein the first semiconductor dies are spaced apart from each other;
at least one bonding film formed on the first semiconductor dies and bonded to the package substrate;
a protective layer formed on sidewalls of each of the first semiconductor dies and a sidewall of the at least one bonding film, wherein the width of the protective layer gradually decreases away from the package substrate along the sidewall of the at least one bonding film; and
a dielectric material formed between adjacent two of the first semiconductor dies and sandwiched by the protective layer, wherein a width of the dielectric material between the adjacent two of the first semiconductor dies gradually increases towards the package substrate along a vertical direction.

9. The semiconductor package as claimed in claim 8, wherein the protective layer is in contact with each of the first semiconductor dies and the dielectric material.

10. The semiconductor package as claimed in claim 8, wherein the protective layer has a curved profile.

11. The semiconductor package as claimed in claim 8, further comprising a second semiconductor die disposed over and electrically connected to one of the first semiconductor dies.

12. The semiconductor package as claimed in claim 8, wherein the at least one bonding film comprises a first bonding film formed on a front surface of the package substrate, and the protective layer ends at a front surface of the first bonding film.

13. The semiconductor package as claimed in claim 12, wherein the at least one bonding film comprises a second bonding film bonded to the first bonding film, and the protective layer is formed on a sidewall of the second bonding film.

14. The semiconductor package as claimed in claim 8, wherein a spacing between the adjacent two of the first semiconductor dies is not less than 15 µm.

15. A semiconductor structure, comprising:
an interconnect structure disposed over a substrate, wherein the interconnect structure comprises metallization patterns in a plurality of dielectric layers and a plurality of etch stop layers alternatively stacked with the dielectric layers;
a protective layer formed on a sidewall of the interconnect structure, wherein the sidewall of the interconnect structure is inclined relative to a normal direction of the substrate, and a width of the protective layer gradually decreases towards the substrate along the sidewall of the interconnect structure; and
a bonding film formed over the interconnect structure, wherein the width of the protective layer gradually increases away from the substrate along a sidewall of the bonding film.

16. The semiconductor structure as claimed in claim 15, further comprising a dielectric material formed on a sidewall of the protective layer.

17. The semiconductor structure as claimed in claim 16, wherein when viewed in the normal direction of the substrate, the dielectric material overlaps with the protective layer.

18. The semiconductor structure as claimed in claim 15, wherein the protective layer is formed on the sidewall of the bonding film.

19. The semiconductor structure as claimed in claim 15, wherein the width of the protective layer is from 10Å to 1000 Å.

20. The semiconductor structure as claimed in claim 8, wherein a top surface of the protective layer is offset from a bottom surface of the protective layer in the top view.

* * * * *